(12) United States Patent
Corisis et al.

(10) Patent No.: US 7,671,459 B2
(45) Date of Patent: Mar. 2, 2010

(54) MICROELECTRONIC DEVICES, STACKED MICROELECTRONIC DEVICES, AND METHODS FOR MANUFACTURING SUCH DEVICES

(75) Inventors: David J. Corisis, Nampa, ID (US); Chin Hui Chong, Singapore (SG); Choon Kuan Lee, Singapore (SG)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 11/414,864

(22) Filed: May 1, 2006

(65) Prior Publication Data
US 2007/0181989 A1 Aug. 9, 2007

(30) Foreign Application Priority Data
Feb. 8, 2006 (SG) .............................. 200601271-0

(51) Int. Cl.
*H01L 23/02* (2006.01)
(52) U.S. Cl. .............................. 257/686; 257/E23.005; 257/E25.013; 257/E25.018; 257/E25.021; 257/E25.027; 257/E21.614; 257/E33.012; 257/E21.503; 257/E21.511; 257/777
(58) Field of Classification Search ........................ None
See application file for complete search history.

(56) References Cited

U.S. PATENT DOCUMENTS

| | | | |
|---|---|---|---|
| 4,012,579 | A | 3/1977 | Fox et al. |
| 4,862,245 | A | 8/1989 | Pashby et al. |
| 5,107,328 | A | 4/1992 | Kinsman |
| 5,128,831 | A | 7/1992 | Fox, III et al. |
| 5,138,434 | A | 8/1992 | Wood et al. |
| 5,140,404 | A | 8/1992 | Fogal et al. |
| 5,252,853 | A | 10/1993 | Michii |
| 5,252,857 | A | 10/1993 | Kane et al. |
| 5,304,842 | A | 4/1994 | Farnworth et al. |
| 5,471,369 | A | 11/1995 | Honda et al. |

(Continued)

FOREIGN PATENT DOCUMENTS

WO WO-2005/022591 3/2005

OTHER PUBLICATIONS

Search Report and Written Opinion for Singapore Application No. 200601271-0, 12 pages, Sep. 5, 2007.

(Continued)

*Primary Examiner*—Minh-Loan T Tran
*Assistant Examiner*—Fei Fei Yeung Lopez
(74) *Attorney, Agent, or Firm*—Perkins Coie LLP

(57) ABSTRACT

Stacked microelectronic devices and methods for manufacturing such devices are disclosed herein. In one embodiment, a stacked microelectronic device assembly can include a first known good packaged microelectronic device including a first interposer substrate. A first die and a first through-casing interconnects are electrically coupled to the first interposer substrate. A first casing at least partially encapsulates the first device such that a portion of each first interconnect is accessible at a top portion of the first casing. A second known good packaged microelectronic device is coupled to the first device in a stacked configuration. The second device can include a second interposer substrate having a plurality of second interposer pads and a second die electrically coupled to the second interposer substrate. The exposed portions of the first interconnects are electrically coupled to corresponding second interposer pads.

11 Claims, 16 Drawing Sheets

U.S. PATENT DOCUMENTS

| | | | |
|---|---|---|---|
| 5,475,918 A | 12/1995 | Kubota et al. | |
| 5,518,957 A | 5/1996 | Kim | |
| 5,536,969 A | 7/1996 | Matsuoka | |
| 5,583,371 A | 12/1996 | Hori | |
| 5,593,927 A | 1/1997 | Farnworth et al. | |
| 5,663,593 A | 9/1997 | Mostafazadeh et al. | |
| 5,665,651 A | 9/1997 | Asada et al. | |
| 5,677,566 A | 10/1997 | King et al. | |
| 5,696,033 A | 12/1997 | Kinsman | |
| 5,715,593 A | 2/1998 | Kimura | |
| 5,726,493 A | 3/1998 | Yamashita et al. | |
| 5,729,049 A | 3/1998 | Corisis et al. | |
| 5,739,585 A | 4/1998 | Akram et al. | |
| 5,744,827 A | 4/1998 | Jeong et al. | |
| D394,844 S | 6/1998 | Farnworth et al. | |
| 5,815,000 A | 9/1998 | Farnworth et al. | |
| D402,638 S | 12/1998 | Farnworth et al. | |
| 5,847,455 A | 12/1998 | Manteghi | |
| 5,851,845 A | 12/1998 | Wood et al. | |
| 5,866,939 A | 2/1999 | Shin et al. | |
| 5,866,953 A | 2/1999 | Akram et al. | |
| 5,879,965 A | 3/1999 | Jiang et al. | |
| 5,883,426 A | 3/1999 | Tokuno et al. | |
| 5,891,753 A | 4/1999 | Akram | |
| 5,891,797 A | 4/1999 | Farrar | |
| 5,893,726 A | 4/1999 | Farnworth et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,956,236 A | 9/1999 | Corisis et al. | |
| 5,958,100 A | 9/1999 | Farnworth et al. | |
| 5,973,393 A | 10/1999 | Chia et al. | |
| 5,973,396 A | 10/1999 | Farnworth | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,356 A | 2/2000 | Kimura | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,051,878 A | 4/2000 | Akram et al. | |
| 6,060,778 A | 5/2000 | Jeong et al. | |
| 6,066,514 A | 5/2000 | King et al. | |
| 6,072,233 A | 6/2000 | Corisis et al. | |
| 6,072,236 A | 6/2000 | Akram et al. | |
| 6,075,284 A | 6/2000 | Choi et al. | |
| 6,075,288 A | 6/2000 | Akram | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,101,100 A | 8/2000 | Londa | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,117,710 A | 9/2000 | Mostafazadeh et al. | |
| 6,124,634 A | 9/2000 | Akram et al. | |
| 6,133,068 A | 10/2000 | Kinsman | |
| 6,137,162 A | 10/2000 | Park et al. | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,175,149 B1 | 1/2001 | Akram | |
| 6,184,465 B1 | 2/2001 | Corisis | |
| 6,198,172 B1 | 3/2001 | King et al. | |
| 6,208,020 B1 | 3/2001 | Minamio et al. | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,215,175 B1 | 4/2001 | Kinsman | |
| 6,215,177 B1 | 4/2001 | Corisis et al. | |
| 6,225,689 B1 | 5/2001 | Moden et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,232,229 B1 | 5/2001 | Reinberg | |
| 6,235,554 B1 * | 5/2001 | Akram et al. | 438/109 |
| 6,246,108 B1 | 6/2001 | Corisis et al. | |
| 6,246,110 B1 | 6/2001 | Kinsman et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,660 B1 | 7/2001 | Tandy | |
| 6,277,671 B1 | 8/2001 | Tripard | |
| 6,277,704 B1 | 8/2001 | Reinberg | |
| 6,281,577 B1 | 8/2001 | Oppermann et al. | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,297,543 B1 | 10/2001 | Hong et al. | |
| 6,297,547 B1 | 10/2001 | Akram | |
| 6,303,469 B1 | 10/2001 | Larson et al. | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,705 B1 | 12/2001 | Ahmad | |
| 6,331,221 B1 | 12/2001 | Cobbley | |
| 6,331,448 B1 | 12/2001 | Ahmad | |
| 6,331,453 B1 | 12/2001 | Bolken et al. | |
| 6,332,766 B1 | 12/2001 | Thummel | |
| 6,337,510 B1 | 1/2002 | Chun-Jen et al. | |
| 6,339,254 B1 | 1/2002 | Venkateshwaran et al. | |
| 6,344,976 B1 | 2/2002 | Schoenfeld et al. | |
| 6,403,398 B2 | 6/2002 | Ohuchi et al. | |
| 6,429,528 B1 | 8/2002 | King et al. | |
| 6,451,624 B1 | 9/2002 | Farnworth et al. | |
| 6,498,393 B2 | 12/2002 | Fujimoto et al. | |
| 6,501,184 B1 | 12/2002 | Shin et al. | |
| 6,516,516 B1 | 2/2003 | Lee | |
| 6,518,659 B1 | 2/2003 | Glenn | |
| 6,548,376 B2 | 4/2003 | Jiang | |
| 6,548,757 B1 | 4/2003 | Russell et al. | |
| 6,552,910 B1 | 4/2003 | Moon et al. | |
| 6,560,117 B2 | 5/2003 | Moon | |
| 6,576,494 B1 | 6/2003 | Farnworth | |
| 6,607,937 B1 | 8/2003 | Corisis | |
| 6,630,729 B2 | 10/2003 | Huang | |
| 6,740,964 B2 * | 5/2004 | Sasaki | 257/687 |
| 6,825,568 B2 * | 11/2004 | Hung | 257/778 |
| 6,876,066 B2 | 4/2005 | Fee et al. | |
| 6,943,450 B2 | 9/2005 | Fee et al. | |
| 6,951,982 B2 | 10/2005 | Chye et al. | |
| 2002/0027273 A1 | 3/2002 | Huang | |

| | | | |
|---|---|---|---|
| 2003/0001285 | A1 | 1/2003 | Shin et al. |
| 2003/0104653 | A1 | 6/2003 | Farnworth |
| 2004/0026773 | A1 | 2/2004 | Koon et al. |
| 2004/0113270 | A1* | 6/2004 | Hedler et al. ............... 257/729 |
| 2005/0026327 | A1* | 2/2005 | Hall et al. .................. 438/108 |
| 2005/0046000 | A1 | 3/2005 | Seng et al. |
| 2005/0224928 | A1* | 10/2005 | Hinkle et al. ............... 257/666 |
| 2006/0019484 | A1 | 1/2006 | Chen et al. |

OTHER PUBLICATIONS

Ishino, Toshiaki, Silicone Adhesive Tape, Nitto Technical Report, vol. 38, No. 2, pp. 49-50, Dec. 2000, <http://www.nitto.com/rd/2000_2/15Ishinoe.qxp.pdf>.

Kuhnlein, Gerd, "A design and manufacturing solution for high reliable non-leaded CSP's like QFN," 2000 Electronics Packaging Technology Conference, pp. 169-175.

Tech Connect, QFN Leadframes, ASM Pacific Technology Ltd., pp. 10-14.

Siliconware Precision Industries Ltd., TSOP 1 (Thin Small Outline Package type1), 2 pages, retrieved from the Internet on Jun. 26, 2003, <http://www.spil.com.tw/tsopi.html>.

Intersil, L56.8X8 56 Lead Quad Flat No-Lead Plastic Package, 1 page, Dec. 2002, <http://www.intersil.com/data/pk/L56.8x8.pdf>.

Carson, John C., "Advances in Chip Level Packaging," Irvine Sensors Corporation, Costa Mesa, California, 36 pages, retrieved from the Internet on Jul. 17, 2003, <http://www.ece.jhu.edu/faculty/andreou/495/2002/LectureNotes/PackagingAdvancedpdf.pdf>.

Amkor Technology: Products: Leadframe: MicroLeadFrame (MLF), Aug. 1, 2001, 5 pages, <http://www.amkor.com/Products/all_products/MLF.cfm>.

Application Notes for Surface Mount Assembly of Amkor's MicroLeadFrame (MLF) Packages, Amkor Technology, Mar. 2001, 14 pages.

Automotive/Thermal Enhanced Power Products, Amkor Technology, Aug. 2000, 16 pages.

RF Wireless Fact Sheet, Amkor Technology, 1 page, Feb. 2000.

International Search Report and Written Opinion for PCT/US2007/062981, mailed Dec. 3, 2007.

* cited by examiner

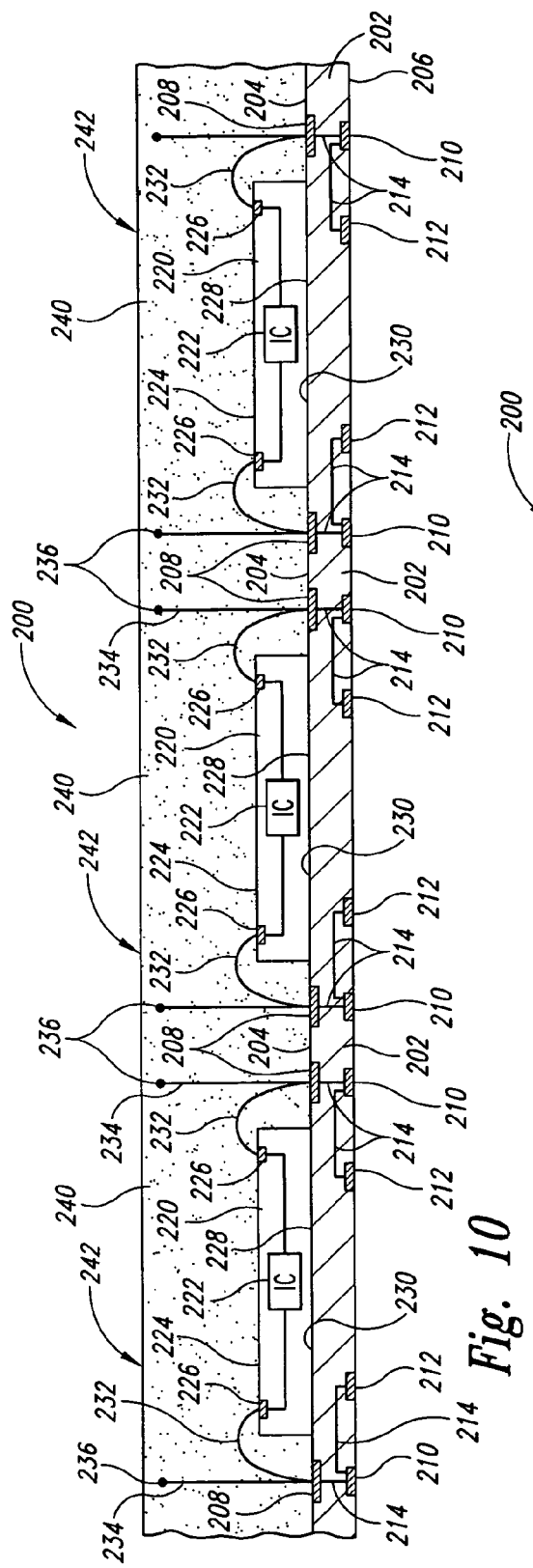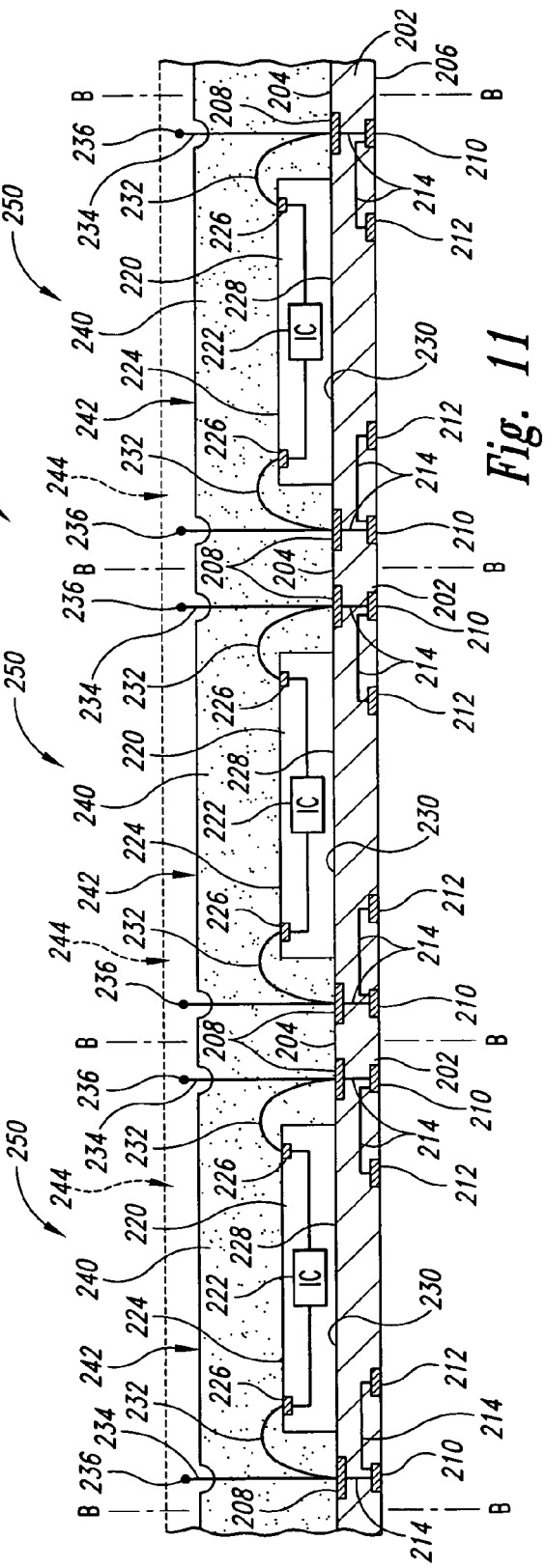

MICROELECTRONIC DEVICES, STACKED MICROELECTRONIC DEVICES, AND METHODS FOR MANUFACTURING SUCH DEVICES

CROSS-REFERENCE TO RELATED APPLICATION

This application claims foreign priority benefits of Singapore Application No. 200601271-0 filed Feb. 28, 2006, which is incorporated herein by reference in its entirety.

TECHNICAL FIELD

The present invention is related to microelectronic devices, stacked microelectronic devices, and methods for manufacturing such devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

An individual die can be packaged by electrically coupling the bond-pads on the die to arrays of pins, ball-pads, or other types of electrical terminals, and then encapsulating the die to protect it from environmental factors (e.g., moisture, particulates, static electricity, and physical impact). In one application, the bond-pads are electrically connected to contacts on an interposer substrate that has an array of ball-pads. FIG. 1A schematically illustrates a conventional packaged microelectronic device 10 including an interposer substrate 20 and a microelectronic die 40 attached to the interposer substrate 20. The microelectronic die 40 has been encapsulated with a casing 30 to protect the die 40 from environmental factors.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the surface area or "footprint" of the microelectronic device 10 on a printed circuit board. Reducing the size of the microelectronic device 10 is difficult because high performance microelectronic devices 10 generally have more bond-pads, which result in larger ball-grid arrays and thus larger footprints. One technique used to increase the density of microelectronic devices 10 within a given footprint is to stack one microelectronic device 10 on top of another.

FIG. 1B schematically illustrates a first packaged microelectronic device 10a attached to a second similar microelectronic device 10b in a stacked configuration. The interposer substrate 20 of the first microelectronic device 10a is coupled to the interposer substrate 20 of the second microelectronic device 10b by large solder balls 50. One drawback of the stacked devices 10a-b is that the large solder balls 50 required to span the distance between the two interposer substrates 20 use valuable space on the interposer substrates 20, which increases the footprint of the microelectronic devices 10a-b.

FIG. 2 schematically illustrates another packaged microelectronic device 60 in accordance with the prior art. The device 60 includes a first microelectronic die 70a attached to a substrate 80 and a second microelectronic die 70b attached to the first die 70a. The first and second dies 70a-b are electrically coupled to the substrate 80 with a plurality of wire-bonds 90, and the device 60 further includes a casing 95 encapsulating the dies 70a-b and wire-bonds 90. One drawback of the packaged microelectronic device 60 illustrated in FIG. 2 is that if one of the dies 70a-b fails a post-encapsulation quality control test then the packaged device 60, including the good die 70, is typically discarded. Similarly, if one of the dies 70a-b becomes inoperable and/or is damaged after packaging, the entire packaged device 60 (rather than just the bad die) is generally discarded. Accordingly, there is a need to provide stacked microelectronic device packages that have small footprints and good dies.

BRIEF DESCRIPTION OF THE DRAWINGS

FIGS. 8-13 illustrate stages of a method for manufacturing a plurality of stacked microelectronic devices in accordance with another embodiment of the invention.

DETAILED DESCRIPTION

A. Overview/Summary

Figure 1A:
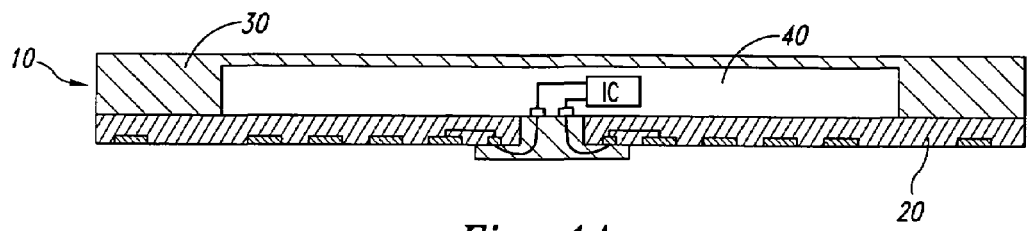
FIG. 1A is a partially schematic side cross-sectional view of a conventional packaged microelectronic device in accordance with the prior art.

The following disclosure describes several embodiments of microelectronic devices, stacked microelectronic devices, and methods for manufacturing such devices. One aspect of the invention is directed toward a stacked microelectronic device assembly including a first known good packaged microelectronic device and a second known good packaged microelectronic device coupled to the first device in a stacked configuration. The first device can include a first interposer substrate with a plurality of first interposer contacts and a first die carried by and electrically coupled to the first interposer contacts. The first device can also include a first casing having a first face at the first interposer substrate and a second face opposite the first face such that the first casing encapsulates the first die and at least a portion of the first interposer substrate. The first device can further include a plurality of first through-casing interconnects at least partially encapsulated in the first casing and in contact with corresponding first interposer contacts. The first interconnects extend from the first face to the second face.

The second device can include a second interposer substrate with a plurality of second interposer pads and a second die carried by and electrically coupled to the second interposer substrate. The second device can also include a second casing that encapsulates the second die and at least a portion of the second interposer substrate. The second interposer pads are electrically coupled to the exposed portions of the corresponding first interconnects at the second face of the first casing.

The first interconnects can have a number of different configurations. In one embodiment, for example, the first interconnects comprise a plurality of lead fingers attached to the first side of the first interposer substrate and projecting inwardly from a periphery of the first casing toward the first die. The lead fingers can be in contact with and electrically coupled to corresponding first interposer contacts. In another embodiment, the first interconnects comprise filaments attached to and projecting from the first interposer contacts. In still another embodiment, the first interconnects comprise a plurality of openings extending through the first casing and generally aligned with corresponding first interposer contacts. The individual openings can be at least partially filled with a conductive material (e.g., a solder material deposited into the openings using a reflow process). In some embodiments, the first interconnects are at least partially aligned with a periphery of the first casing such that at least a portion of each interconnect is accessible along the periphery of the first casing. In other embodiments, however, the first interconnects are inboard of the periphery of the first casing such that the first interconnects are not accessible along the periphery. In several embodiments, the second device can further include a plurality of second through-casing interconnects at least partially encapsulated in the second casing and in contact with corresponding second interposer contacts on the second interposer substrate. The second interconnects can include features generally similar to the first interconnects described above. In still further embodiments, one or more additional known good packaged microelectronic devices can be attached and electrically coupled to the second device in a stacked configuration.

Another aspect of the invention is directed toward methods for manufacturing microelectronic devices. One embodiment of such a method includes positioning a first known good packaged microelectronic device proximate to a second known good packaged microelectronic device. The first device can include a first interposer substrate, a first die electrically coupled to the first interposer substrate, and a plurality of electrically conductive interconnects electrically coupled to the interposer substrate. The first die, at least a portion of the first interposer substrate, and at least a portion of the first interconnects are encased in a first casing. The first interconnects have accessible terminals at a top portion of the first casing. The method also includes mounting the second device to the first device in a stacked configuration. The second device can include a second interposer substrate and a second die electrically coupled to the second interposer substrate. A second casing covers the second die and at least a portion of the second interposer substrate. The terminals of the first interconnects at the top portion of the first casing are electrically coupled to corresponding interposer pads of the second interposer substrate.

The terms "assembly" and "subassembly" are used throughout to include a variety of articles of manufacture, including, e.g., semiconductor wafers having active components, individual integrated circuit dies, packaged dies, and devices comprising two or more microfeature workpieces or components, e.g., a stacked die package. Many specific details of certain embodiments of the invention are set forth in the following description and in FIGS. 3A-20 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention.

Figure 3A:
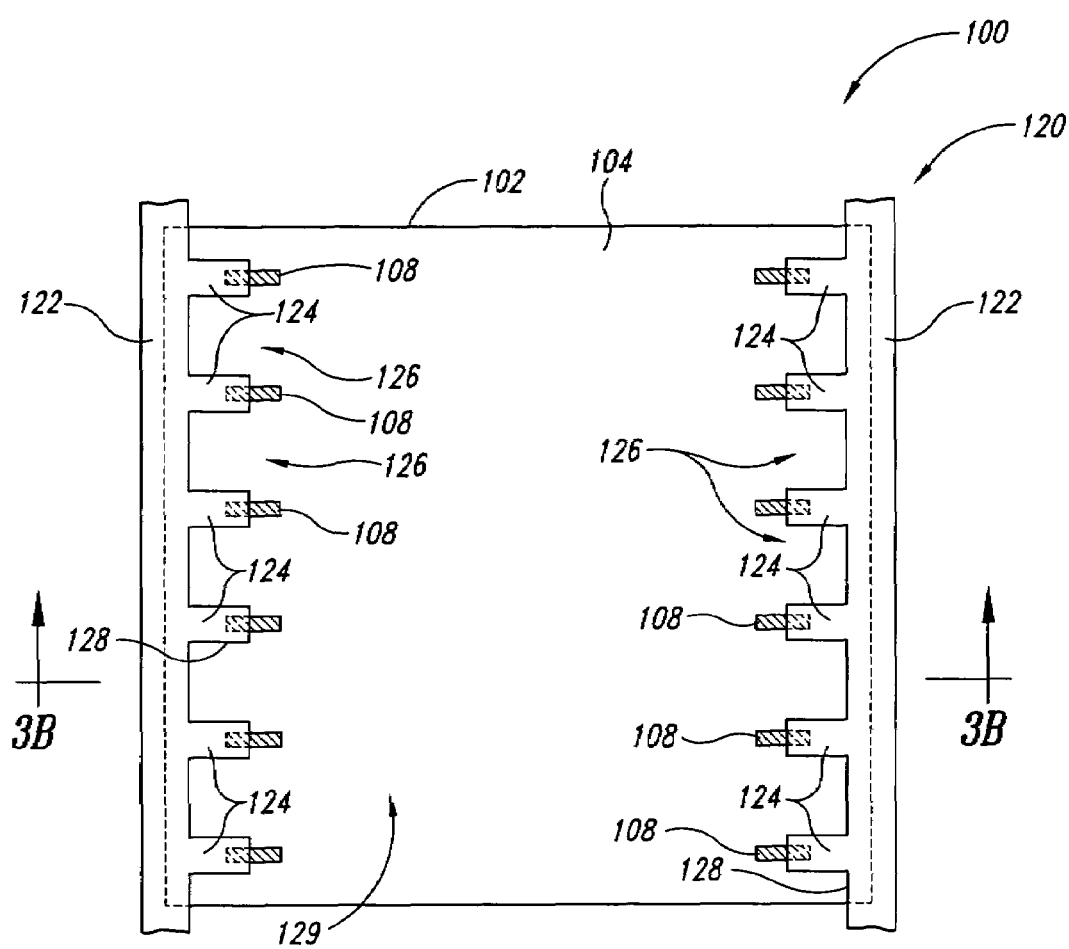
FIGS. 3A-7 illustrate stages of a method for manufacturing a plurality of stacked microelectronic devices in accordance with one embodiment of the invention.
Figure 3B:
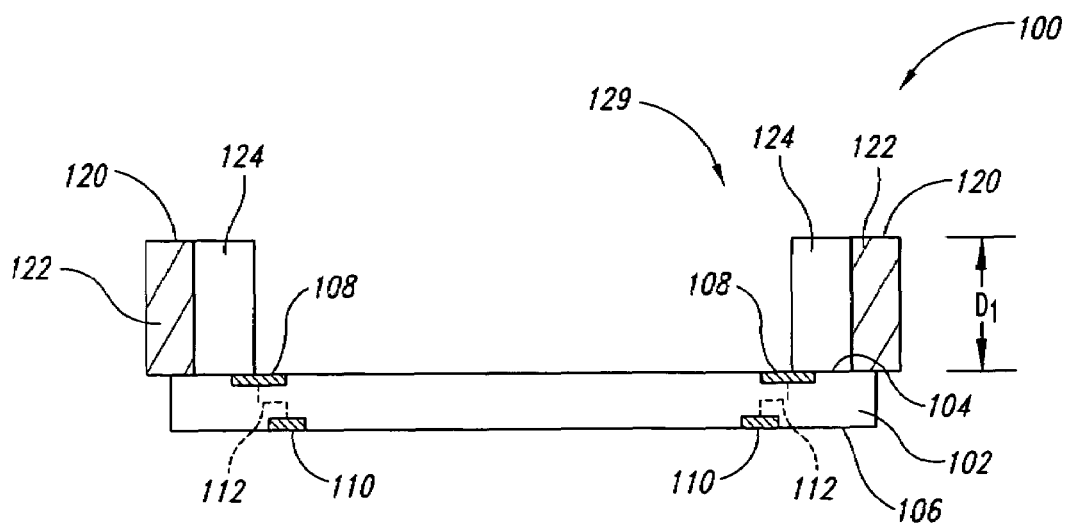

B. Embodiments of Methods for Manufacturing Stacked Microelectronic Devices and Microelectronic Devices Formed Using Such Methods FIGS. 3A-7 illustrate stages in a method for manufacturing a plurality of stacked microelectronic devices in accordance with one embodiment of the invention. More specifically, FIG. 3A is a partially schematic, top plan view of a subassembly 100 at an initial stage of the method, and FIG. 3B is a side cross-sectional view taken substantially along line 3B-3B of FIG. 3A. Referring to FIGS. 3A and 3B together, the subassembly 100 includes a support member 102, such as an interposer substrate, a printed circuit board, or another suitable structure, and a lead frame 120 on the support member. In the illustrated embodiment, the support member 102 includes (a) a first side 104 having a plurality of contacts 108, (b) a second side 106 opposite the first side 104 and having a plurality of pads 110, and (c) a plurality of traces 112 or other type of conductive lines between the contacts 108 and corresponding pads 110 or other contacts (not shown) at the second side 106 of the support member 102. The contacts 108 can be arranged in arrays for electrical connection to corresponding contacts on the lead frame 120 and/or one or more microelectronic dies attached to the support member 102, as described in more detail below. In one aspect of this embodiment, the pads 110 at the second side 106 of the support member 102 are arranged in an array corresponding to a standard JEDEC pinout. In other embodiments, the support member 102 may include a different number or arrangement of contacts/pads at the first side 104 and/or second side 106.

The lead frame 120 is a self-supporting structure that generally includes a peripheral dam 122 and a plurality of lead fingers 124 projecting inwardly of the peripheral dam 122. The lead fingers 124 are spaced from one another by gaps 126 therebetween. The inner surfaces of the peripheral dam 122 and each of the lead fingers 124 together form an inner periphery 128 of an opening 129 in the lead frame 120. In this example, the opening 129 extends through the entire thickness of the lead frame 120. The lead frame 120 can be formed of a metal or another suitable conductive material. In some embodiments, the lead frame 120 can be a conductive material that is plated with a noble metal, such as gold, silver, or palladium, or the lead frame 120 can be a non-conductive material coated with a conductive material. A portion of each lead finger 124 contacts a corresponding contact 108 on the support member 102.

Although six lead fingers 124 are shown in the illustrated embodiment, the lead frame 120 can have a different number of lead fingers 124 based, at least in part, on the configuration of the microelectronic die that is to be electrically coupled to the lead frame 120. In still other embodiments, the lead fingers 124 can include more complex shapes instead of the fairly simple, block-shaped lead fingers 124 shown in the illustrated embodiment.

In one aspect of this embodiment, the peripheral dam 122 and each of the lead fingers 124 have generally the same height $D_1$. As described in more detail below, the height $D_1$ should be greater than the height of a microelectronic die to be positioned on the support member 102. In other embodiments, however, the height of the lead fingers 124 may be different than the height of the peripheral dam 122.

Figure 4A:
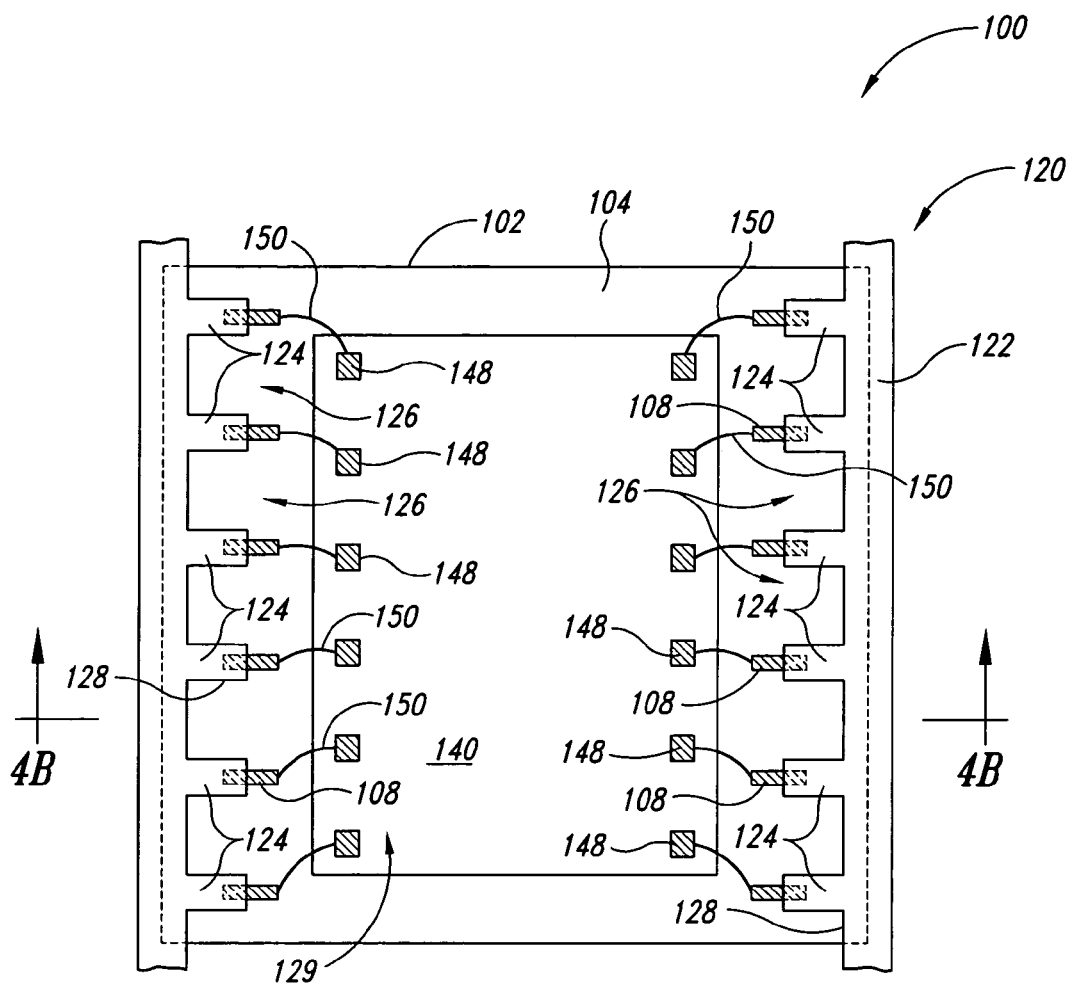
Figure 4B:
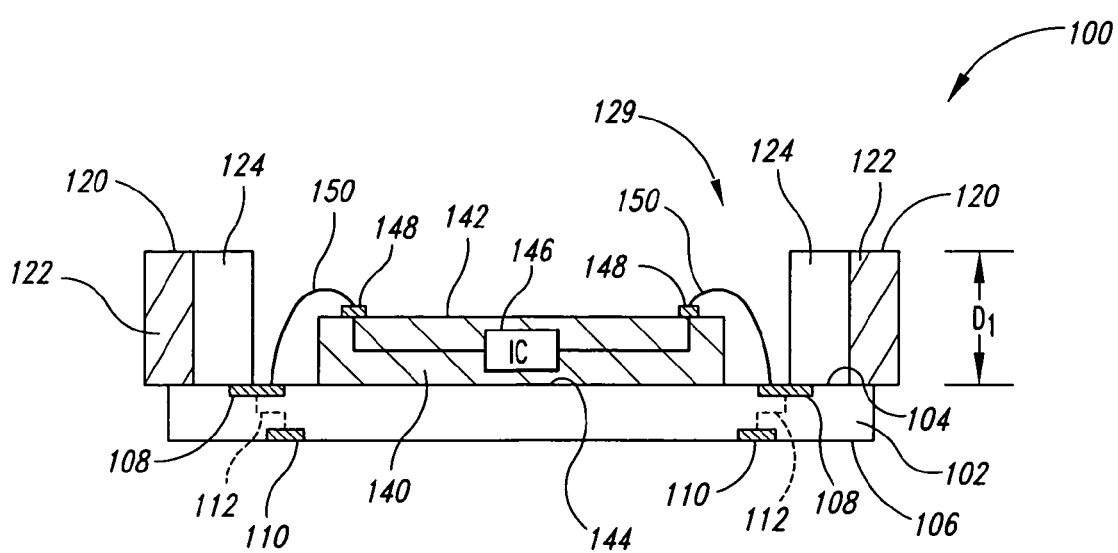

Referring next to FIGS. 4A and 4B, a microelectronic die 140 may be positioned within the opening 129 of the lead frame 120. Although only a single lead frame 120 and die 140 are shown attached to the support member 102, a plurality of lead frames 120 and dies 140 can be attached to the support member 102 for manufacturing a plurality of microelectronic devices. The die 140 can include a front or active side 142, a back side 144 opposite the active side 142, and integrated circuitry 146 (shown schematically). The back side 144 of the die 140 is attached to the exposed first side 104 of the support member 102 within the opening 129. The die 140 can also include a plurality of terminals 148 (e.g., bond-pads) arranged in an array at the active side 142 and electrically coupled to the integrated circuitry 146. The terminals 148 accordingly provide external contacts to provide source voltages, ground voltages, and signals to the integrated circuitry 146 in the die 140. In the illustrated embodiment, the terminals 148 are adjacent to the periphery of the die 140 and electrically coupled to corresponding contacts 108 on the support member 102 by wire-bonds 150 or other types of connectors. The wire-bonds 150 generally include a loop height that remains below the height $D_1$ of the lead frame 120 to ensure complete encapsulation of the wire-bonds 150 by an encapsulant, as described in more detail below.

In other embodiments, the die 140 can have other features and/or the die can be attached and electrically coupled to the support member 102 using other arrangements, such as a flip-chip configuration (FCIP) or another suitable method. Furthermore, the order in which the lead frame 120 and die 140 are attached to the support member 102 can be varied. In the embodiment described above, the lead frame 120 is attached to the support member 102 before the die 140 is attached to the support member. In other embodiments, however, the die 140 can be attached to the support member 102 before the lead frame 120 is attached to the support member. In still further embodiments, the lead frame 120 and the die 140 may be simultaneously attached to the support member 102.

Figure 5A:
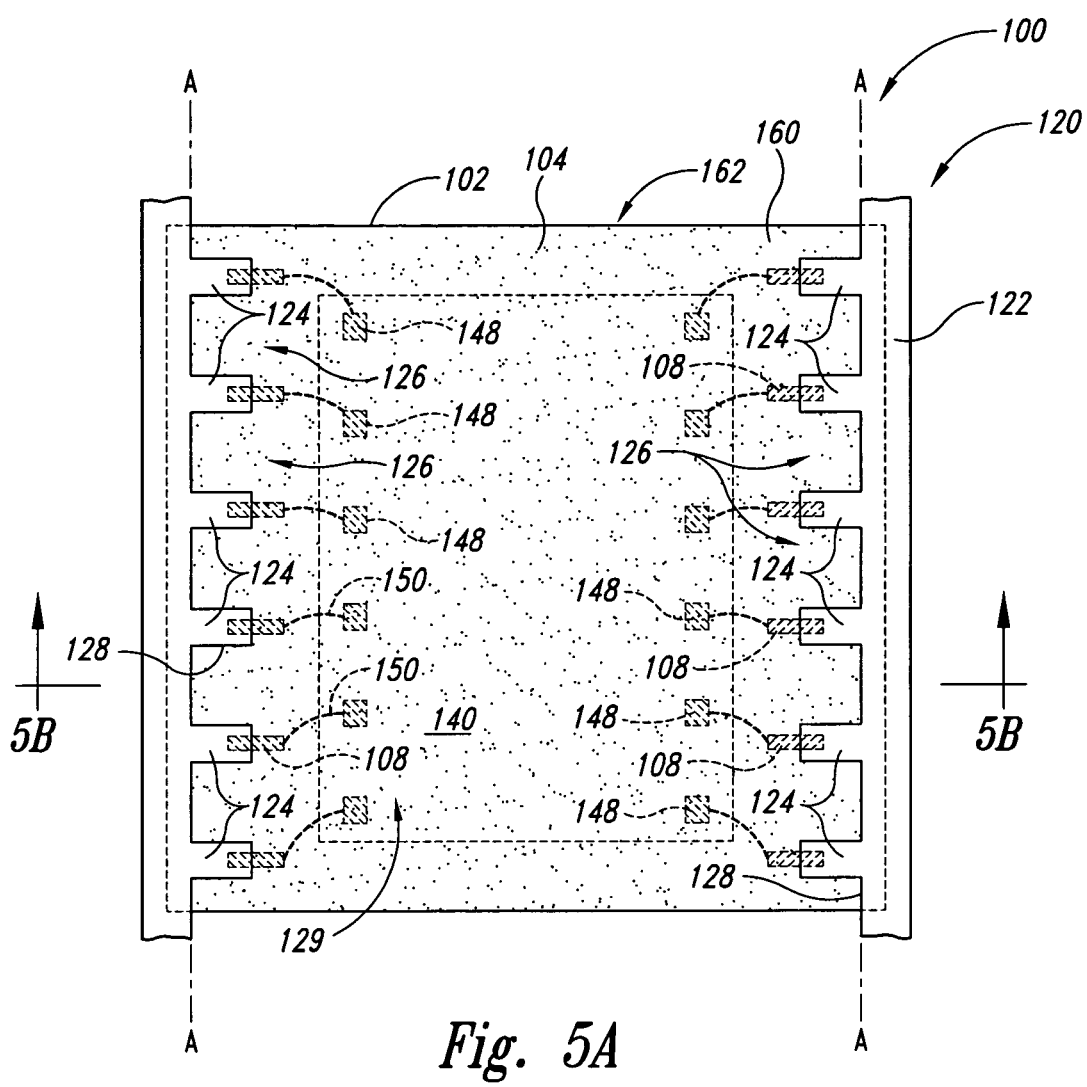
Figure 5B:
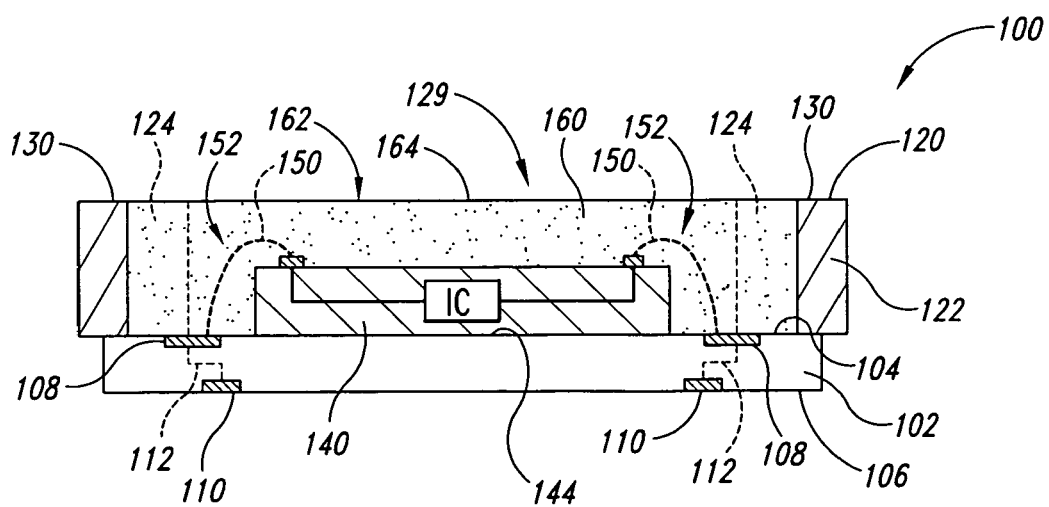

Referring next to FIGS. 5A and 5B, an encapsulant 160 may be disposed in the opening 129 after the die 140 is electrically coupled to the contacts 108 to form a casing 162 that encapsulates at least a portion of the subassembly 100. More particularly, the exposed first side 104 of the support member 102, the inner periphery 128 of the lead frame 120, and the die 140 define a cavity 152 within the opening 129 that may be partially or completely filled with the encapsulant 160 to form the casing 162. In the illustrated embodiment, the cavity 152 is completely filled with the encapsulant 160 such that an upper portion 164 of the casing 162 is substantially coplanar with an upper portion 130 of the lead fingers 124. In other embodiments, however, the upper portion 164 of the casing 162 may be below the upper portion 130 of the lead fingers 124 as long as the die 140 and corresponding wire-bonds 150 are completely encapsulated.

The encapsulant 160 can be deposited into the opening 129 using a suitable application process, such as conventional injection molding, film molding, or other suitable process. In several embodiments, the encapsulant 160 is delivered to the cavity 152 and is allowed to simply fill the cavity and cover the die 140 and wire-bonds 150. If any encapsulant 160 flows outwardly over the upper portion 130 of the lead fingers 124, the overburden of encapsulant material can be removed by grinding, polishing, or other suitable techniques. In other embodiments, however, the flow of encapsulant 160 can be limited by use of a molding element (not shown) having a substantially flat molding surface that lies substantially flush against the upper portion 130 of the lead fingers 124 to keep the encapsulant 160 from flowing over the lead frame 120.

As best seen in FIG. 5A, the peripheral dam 122 physically connects each of the lead fingers 124 to each other and helps define the cavity 152 for receiving the encapsulant 160 as described above. Once the casing 162 is in place, however, the peripheral dam 122 is no longer needed. Accordingly, the subassembly 100 can be cut along lines A-A to remove the peripheral dam 122 and form a packaged microelectronic device 170 (FIGS. 6A and 6B) having a plurality of isolated lead fingers 124 spaced about a periphery of the device 170. The subassembly 100 can be cut using a conventional wafer saw, high-pressure water jets, lasers, or the like. In other embodiments, the lines A-A can be moved slightly inward toward the die 140 such that a portion of each lead finger 124 is also removed along with the peripheral dam 122.

Figure 6A:
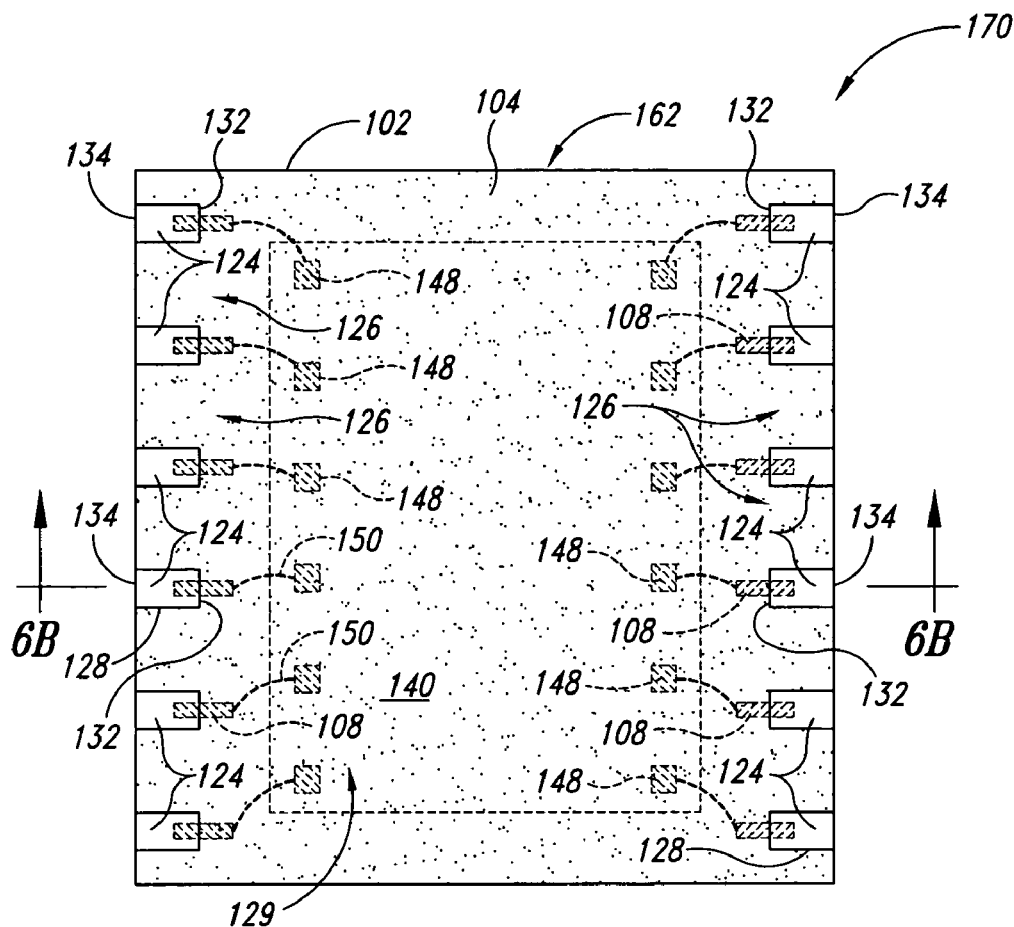
Figure 6B:
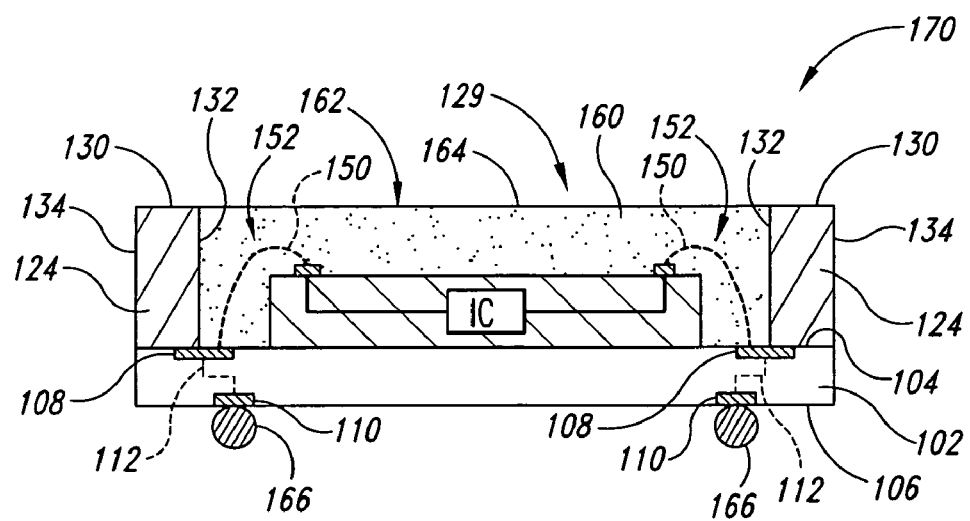

Referring next to FIGS. 6A and 6B, the device 170 can be tested post-packaging to ensure that the device functions properly so that only known good devices undergo further processing. Furthermore, a plurality of electrical couplers 166 (e.g., solder balls) can be attached to corresponding pads 110 at the second side 106 of the support member 102. The electrical couplers 166 are generally attached to the device 170 after testing to ensure that the couplers are only attached to known good devices, but in some embodiments the couplers can be attached to the device before testing.

One feature of the device 170 is that the upper portion 164 of the casing 162 is substantially coplanar with the upper portion 130 of the lead fingers 124. The device 170 is accordingly a mechanically stable structure wherein each of the lead fingers 124 defines an electrical pathway between the pads 110 at the second side 106 of the support member 102 and the upper portion 130 of corresponding lead fingers 124. As explained below, this feature can facilitate stacking of two or more devices 170. Another feature of the device 170 is that at least a portion of each lead finger 124 is accessible along a periphery of the casing 162. More specifically, each lead finger 124 includes a front surface 132 facing toward the die 140 and a back surface 134 opposite the front surface 132 and generally aligned with the periphery of the casing 162. One advantage of this feature is that the accessible back surface 134 of each lead finger 124 can provide additional contact points to facilitate testing of the device 170.

Figure 7:
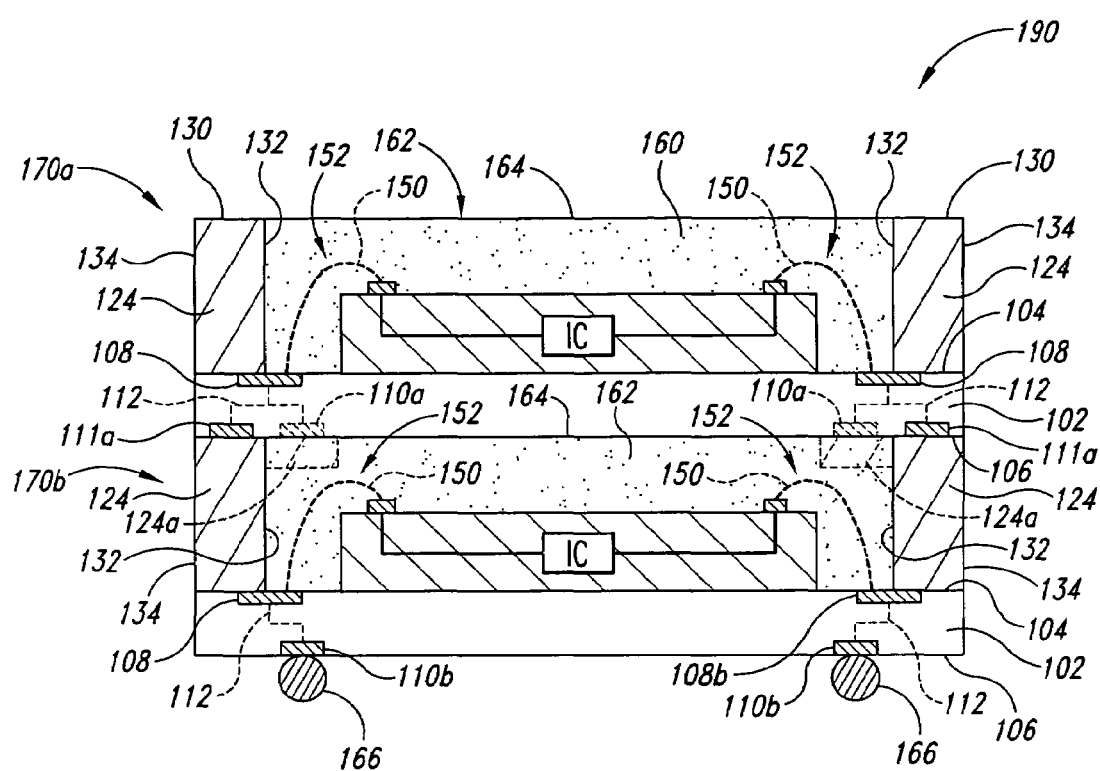

FIG. 7 is a side cross-sectional view of a stacked microelectronic device assembly 190 including an upper microelectronic device 170a stacked on top of a lower microelectronic device 170b. The upper and lower devices 170a and 170b can be generally similar to the microelectronic device 170 described above with respect to FIGS. 6A and 6B. The upper device 170a differs from the device 170 described above, however, in that the device 170a includes an array of pads 111a at the second side 106 of the support member 102 having a different arrangement than the array of pads 110 of the device 170. More specifically, the device 170a is configured to be an "upper" device in a stacked assembly and, accordingly, the pads 111a are arranged such that they contact corresponding lead fingers 124 of the lower device 170b to electrically couple the upper device 170a and lower device 170b together. Furthermore, the upper device 170a does not generally include electrical couplers attached to the pads 111a. In other embodiments, the upper device 170a and/or lower device 170b can have different arrangements. For example, the upper device 170a can include a plurality of pads 110a (shown in broken lines) having an arrangement generally similar to the arrangement of pads 110 of the device 170 described above. The lead fingers 124 of the lower device 170b can include engagement portions 124a (shown in broken lines) projecting from the front surface 132 of each lead finger 124 and configured to contact corresponding pads 110a. In still other embodiments, the upper and lower device 170a and 170b can include other features.

The upper device 170a is coupled to the lower device 170b by attaching and electrically coupling the pads 111a of the upper device 170a to corresponding lead fingers 124 on the lower device 170b. In the illustrated embodiment, the second side 106 of the upper device's support member 102 is in direct contact with the upper portion 164 of the lower device's casing 162. Accordingly, the stacked assembly 190 does not include a fill material between the upper and lower devices 170a and 170b. As mentioned previously, however, in other embodiments the upper portion 164 of the casing 162 may not be coplanar with the upper portion 130 of the lead fingers 124 and, accordingly, a fill material (not shown) may be deposited into a gap or cavity between the upper device 170a and the lower device 170b. The fill material (e.g., an epoxy resin or other suitable molding compound) can enhance the integrity of the stacked assembly 190 and protect the components of the upper device and the lower device from moisture, chemicals, and other contaminants. The fill material, however, is an optional component.

One advantage of the devices 170 formed using the methods described above with reference to FIGS. 3A-7 is that the devices can be stacked on top of each other. Stacking microelectronic devices increases the capacity and/or performance within a given surface area or footprint. For example, when the upper microelectronic device 170a is stacked on top of the lower microelectronic device 170b and the lower device 170b is attached to a circuit board or other external device, the upper microelectronic device 170a is electrically and operably coupled to the circuit board or external device without using any more surface area on the circuit board.

One feature of the stacked assembly 190 is that both the upper and lower devices 170a and 170b can be tested after packaging and before stacking to ensure that they function properly before being assembled together. Throughput of stacked assemblies 190 can accordingly be increased because defective devices can be detected and excluded from the stacked assemblies 190 formed using the methods described above and each assembly will generally include only known good devices. This increases the yield of the packaging processes described above and reduces the number of devices that malfunction and/or include defects.

Figure 1B:
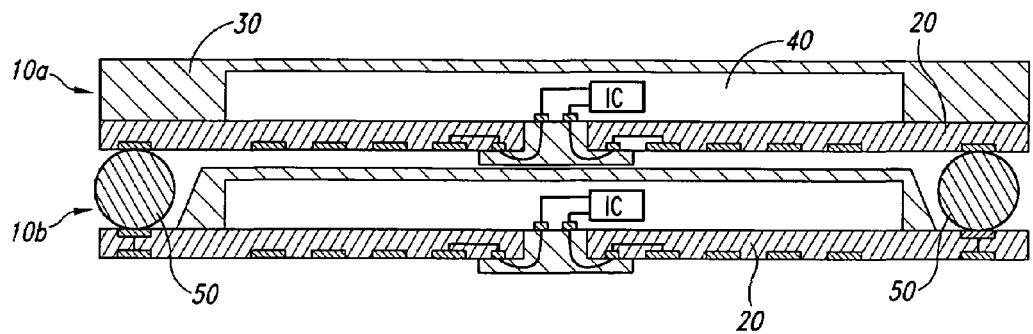
FIG. 1B is a partially schematic side cross-sectional view of the packaged microelectronic device of FIG. 1A stacked on top of a second similar microelectronic device.
Figure 2:
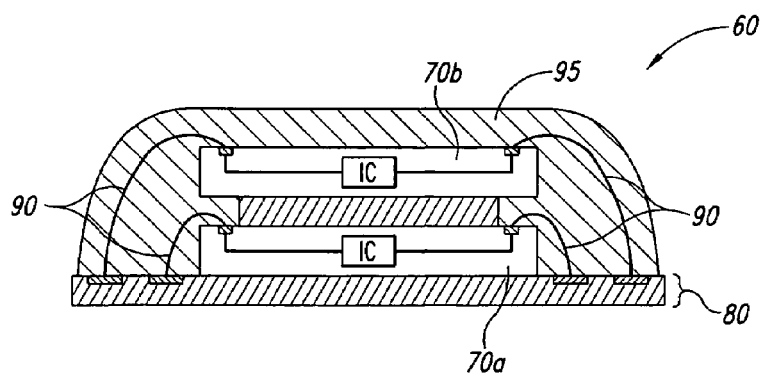
FIG. 2 is a partially schematic side cross-sectional view of another packaged microelectronic device in accordance with the prior art.

Still another feature of the devices 170 described above with reference to FIGS. 3A-7 is that the electrical couplers 166 are positioned inboard of the lead fingers 124. An advantage of this feature is that the footprint of the stacked assembly 190 is reduced as compared with conventional stacked devices, such as the devices 10a and 10b illustrated in FIG. 1B where the solder balls 50 are outboard of the dies 40. Minimizing the footprint of microelectronic devices is particularly important in cell phones, PDAs, and other electronic products where there is a constant drive to reduce the size of microelectronic components used in such devices.

C. Additional Embodiments of Methods for Manufacturing Stacked Microelectronic Devices and Microelectronic Devices Formed Using Such Methods FIGS. 8-21 illustrate various stages in other embodiments of methods for manufacturing stacked microelectronic devices. The following methods and devices formed using such methods can have many of the same advantages as the devices 170 and the stacked assembly 190 described above with respect to FIGS. 3A-7.

Figure 8:
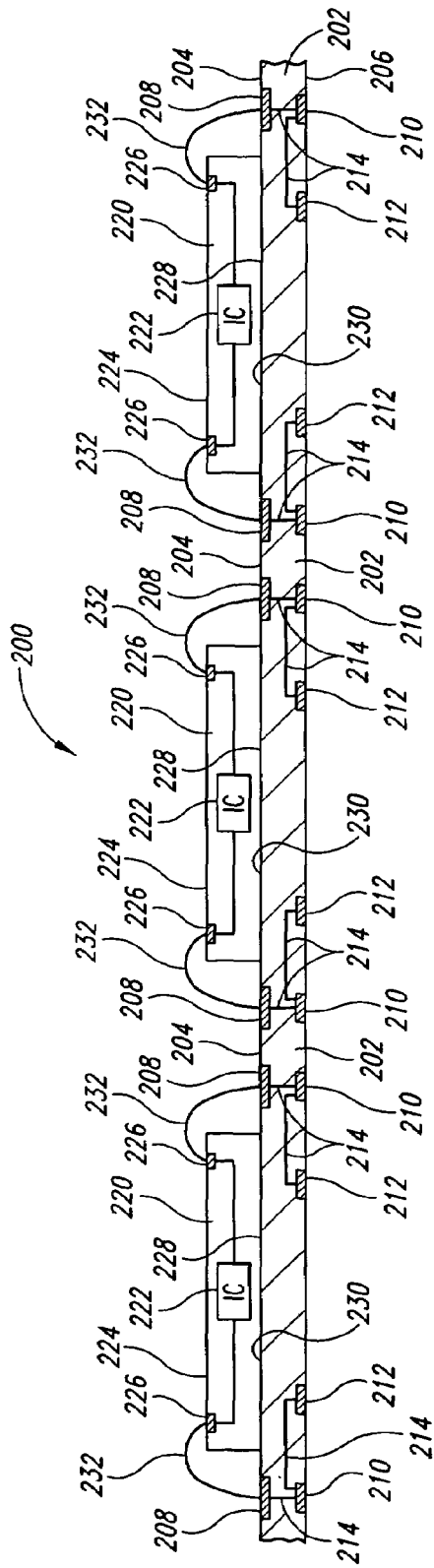

FIG. 8, for example, is a schematic side cross-sectional view of a subassembly 200 including a plurality of microelectronic dies 220 (only three are shown) arranged in an array on a support member 202. The support member 202 can include an interposer substrate, a printed circuit board, or other suitable support member for carrying the dies 220. In the illustrated embodiment, the support member 202 includes (a) a first side 204 having a plurality of contacts 208, and (b) a second side 206 having a plurality of first pads 210 and a plurality of second pads 212. The contacts 208 can be arranged in arrays for electrical connection to corresponding terminals on the dies 220 and the first and second pads 210 and 212 can be arranged in arrays to receive a plurality of electrical couplers (e.g., solder balls) and/or other types of electrical interconnects. The support member 202 further includes a plurality of conductive traces 214 electrically coupling the contacts 208 to corresponding first and second pads 210 and 212. In one aspect of this embodiment, the first and/or second pads 210 and 212 at the second side 206 of the support member 202 are arranged in an array corresponding to a standard JEDEC pinout. In other embodiments, the support member 202 may include a different number or arrangement of contacts/pads at the first side 204 and/or the second side 206.

The individual dies 220 include integrated circuitry 222 (shown schematically), a front or active side 224, a plurality of terminals 226 (e.g., bond-pads) arranged in an array at the active side 224 and electrically coupled to the integrated circuitry 222, and a back side 228 opposite the active side 224. The back sides 228 of the dies 220 are attached to the support member 202 with an adhesive 230, such as an adhesive film, epoxy, tape, paste, or other suitable material. A plurality of wire-bonds 232 or other types of connectors couple the terminals 226 on the dies 220 to corresponding contacts 208 on the support member 202. Although the illustrated dies 220 have the same structure, in other embodiments, the dies 220 may have different features to perform different functions. In further embodiments, the dies 220 may be attached and electrically coupled to the support member 202 using other arrangements, such as an FCIP configuration or another suitable method.

Figure 9:
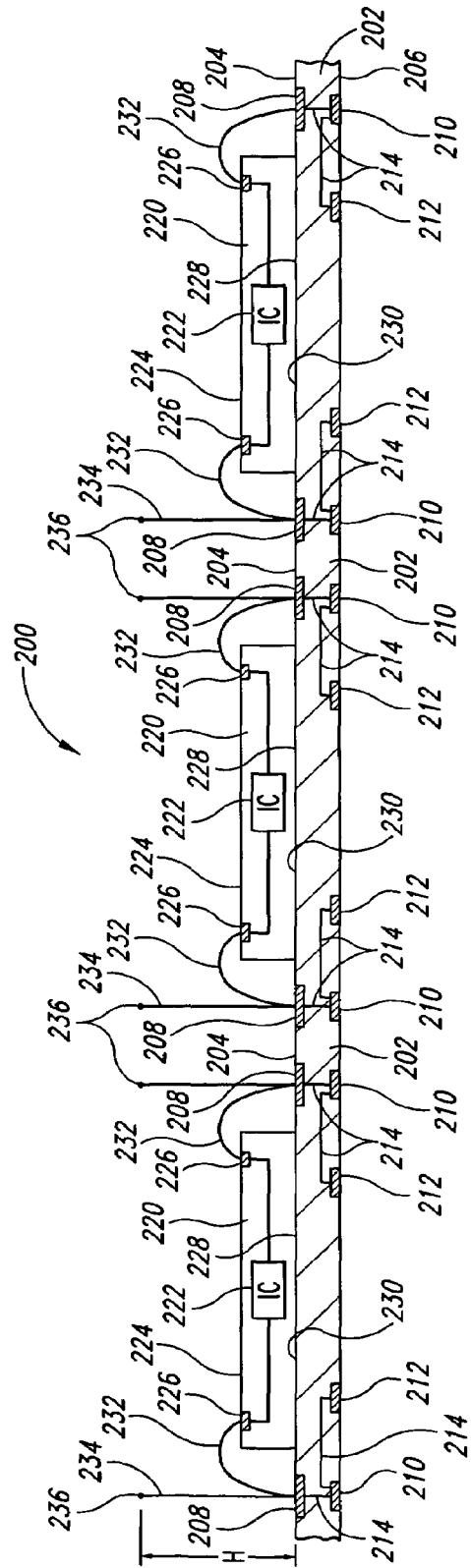

FIG. 9 is a schematic side cross-sectional view of the subassembly 200 after attaching a plurality of interconnects or filaments 234 to the contacts 208 at the first side 204 of the support member 202. The interconnects or filaments 234 can include thin, flexible wires attached and electrically coupled to corresponding contacts 208. In the illustrated embodiment, for example, the interconnects 234 include relatively straight, free-standing wire-bond lines that are attached to and project away from the contacts 208 in a direction generally normal to the first side 204 of the support member 202. The interconnects 234 include a height H relative to the first side 204 of the support member 202 that is based, at least in part, on the desired height of the resulting packaged device. The interconnects 234 can also include an electrical coupler 236 (e.g., a ball-shaped portion) at a distal end of each interconnect. As described in more detail below, the electrical couplers 236 can help improve joint interconnection with one or more devices that may be stacked on the dies 220. The interconnects 234 are generally attached to the contacts 208 after forming the wire-bonds 232, but in some embodiments the interconnects 234 and wire-bonds 232 can be formed at the same time. In other embodiments, such as the embodiment described below with respect to FIG. 15, the interconnects 234 can have a different arrangement and/or include different features.

Referring to FIG. 10, an encapsulant 240 is deposited onto the support member 202 to form a plurality of casings 242 encapsulating the dies 220, the wire-bonds 232, and at least a portion of the interconnects 234. The encapsulant 240 can be deposited onto the support member 202 using a suitable application process, such as conventional injection molding, film molding, or other suitable process.

Referring next to FIG. 11, a top portion 244 (shown in broken lines) of the casings 242 can be removed to at least partially expose the electrical couplers 236 at the distal end of the interconnects 234. The top portion 244 of the casings 242 can be removed using a laser grinding process or another suitable process. In other embodiments, a mold used during encapsulation of the subassembly 200 can include cavities or recesses corresponding to the arrangement of electrical couplers 236 such that the individual electrical couplers are not encapsulated when forming the casings 242 and, therefore, a grinding or removal process is not necessary. In still other embodiments, the encapsulant 240 can be deposited using another suitable process that leaves the electrical couplers 236 exposed after the device is removed from the mold. In still further embodiments, a laser drilling process can be used after encapsulation to isolate and expose at least a portion of the interconnects 234 and a conductive material (e.g., gold) can be deposited into the resulting vias to create a plurality of conductive pads in a desired arrangement at the top portion 244 of the casing 242. If desired, a redistribution structure can then be formed at the top portion 244 to redistribute the signals from the conductive pads to a larger array of contacts. After at least partially exposing the electrical couplers 236 of the interconnects 234, the subassembly 200 can be cut along lines B-B to singulate a plurality of individual microelectronic devices 250.

Figure 12:
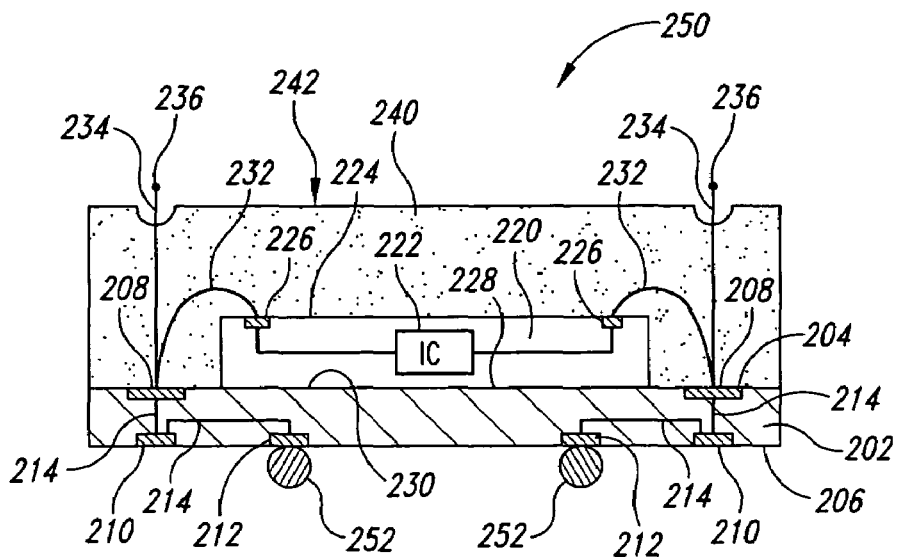

Referring next to FIG. 12, the individual devices 250 can be tested post-packaging to ensure that each device functions properly so that only known good devices undergo further processing. Further, a plurality of electrical couplers 252 (e.g., solder balls) can be attached to corresponding pads 212 at the second side 206 of the support member 202. The electrical couplers 252 are generally attached to the devices 250 after testing to ensure that the couplers are only attached to known good devices, but in some embodiments the couplers can be attached to the devices before testing.

Figure 13:
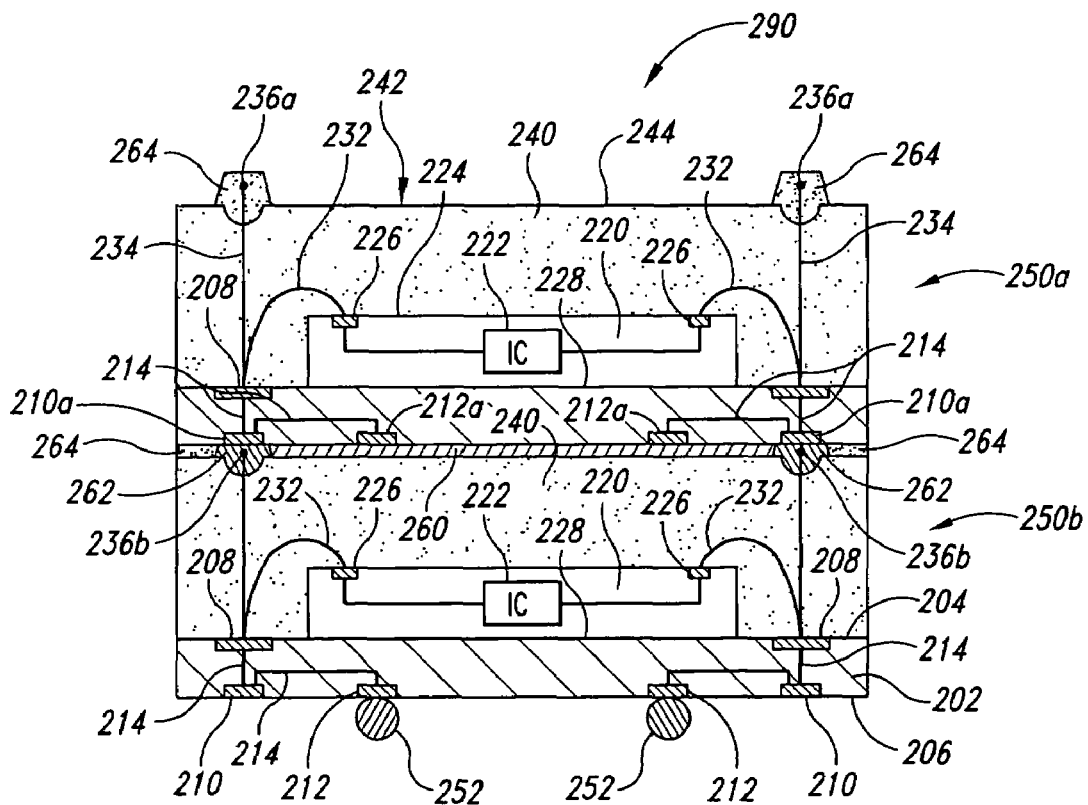

In several embodiments, one or more individual devices 250 can be stacked together to form stacked microelectronic device assemblies. FIG. 13, for example, is a side cross-sectional view of a stacked microelectronic device assembly 290 including an upper microelectronic device 250a stacked on top of a lower microelectronic device 250b. The upper and lower devices 250a and 250b can be generally similar to the devices 250 described above with respect to FIGS. 8-12. The upper device 250a can be coupled to the lower device 250b by attaching the second side 206 of the upper device's support member 202 to the top portion 244 of the lower device's casing 242 with an adhesive material 260, such as an adhesive film, epoxy, tape, paste, or other suitable material. The lower device's electrical couplers 236b can be electrically coupled to corresponding first pads 210a on the upper device 250a. In the illustrated embodiment, for example, each of the electrical couplers 236b is electrically coupled to corresponding first pads 210a with electrical connectors 262. The electrical connectors 262 may also physically bond (at least in part) the upper device 250a to the lower device 250b. The electrical connectors 262 can include solder connections that are reflowed as is known in the art or other suitable connectors.

In several embodiments, a fill material 264 can be deposited into the area between the upper device 250a and the lower device 250b and, if no additional devices are to be stacked on the upper device 250a, over the exposed electrical couplers 236a at the top portion 244 of the upper device 250a. The fill material 264 can enhance the integrity of the stacked assembly 290 and protect the components of the upper and lower devices 250a and 250b from moisture, chemicals, and other contaminants. In one embodiment, the fill material 264 can include a molding compound such as an epoxy resin. In other embodiments, the fill material 264 can include other suitable materials. Depositing the fill material 264 is an optional step that may not be included in some embodiments.

In other embodiments, additional microelectronic devices can be stacked onto the upper microelectronic device 250a by exposing the electrical couplers 236a at the top portion 244 of the upper device 250a, stacking one or more additional devices (not shown) onto the upper device 250a, and electrically coupling the additional devices to the electrical couplers 236a. In still further embodiments, the upper and lower devices 250a and 250b can be different devices. For example, the microelectronic dies 220 in the upper and lower devices 250a and 250b can be the same or different types of dies and/or the upper and lower devices 250a and 250b can include other features.

Figure 14:
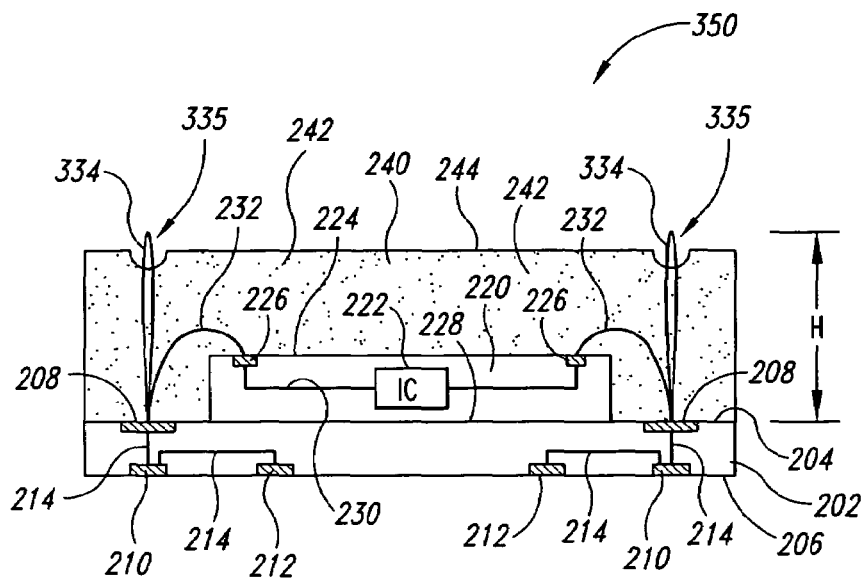
FIG. 14 is a partially schematic side cross-sectional view of a microelectronic device configured in accordance with still another embodiment of the invention.

FIG. 14 illustrates a microelectronic device 350 configured in accordance with another embodiment of the invention. The microelectronic device 350 is generally similar to the microelectronic devices 250 described above with reference to FIGS. 8-12. Accordingly, like reference numbers are used to refer to like components in FIGS. 8-12 and FIG. 14. The device 350 differs from the device 250, however, in that the device 350 includes a interconnect 334 having a different configuration than the interconnect 234 of the device 250. More specifically, the interconnect 334 of the device 350 includes a wire loop such that a ball portion and a stitch portion of the wire are both at the corresponding contacts 208 on the support member 202. The loop-shaped interconnect can have the height H generally similar to the interconnect 234 described above such that a top portion 335 of the interconnect 334 can be exposed at the top portion 244 of the casing 242. One advantage of the loop-shaped interconnects 334 is that such interconnects are generally expected to be more durable than the single-filament interconnects 234 described previously because the loop-shaped interconnects are more securely anchored to the corresponding contacts 208 and, accordingly, are less likely to bend or disconnect from the contacts during molding. Furthermore, in several embodiments the loop-shaped interconnects 334 can provide lower inductance than the interconnects 234.

Figure 15A:
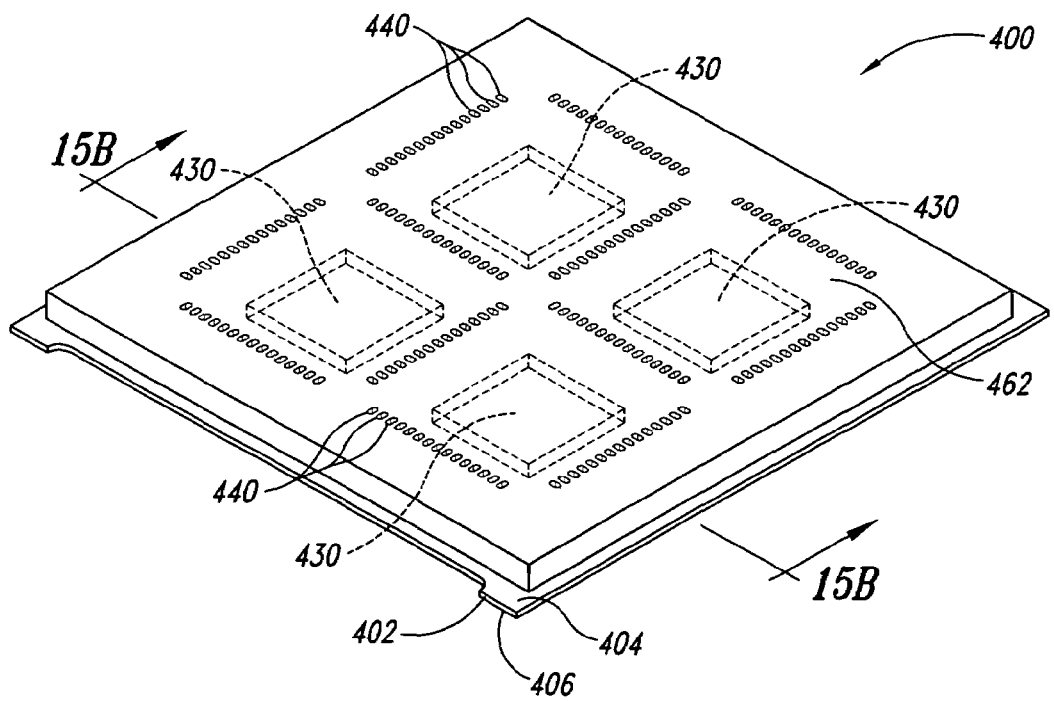
FIGS. 15A-18 illustrate stages of a method for manufacturing a plurality of stacked microelectronic devices in accordance with yet another embodiment of the invention.

FIGS. 15A-18 illustrate stages in yet another embodiment of a method for manufacturing a plurality of stacked microelectronic devices. FIG. 15A, for example, is a partially schematic, isometric view of a subassembly 400 at an initial stage of the method. The subassembly 400 includes a plurality of microelectronic dies 430 (shown in broken lines) arranged in an array on a support member 402 and encapsulated with a casing 462. It will be appreciated that although only four dies 430 are shown attached to the support member 402 in the illustrated embodiment, a different number of dies 430 can be attached to the support member 402 for manufacturing a plurality of microelectronic devices. The subassembly 400 further includes a plurality of small openings or vias 440 (i.e., "pin holes") extending through the casing 462 to a first side 404 of the support member 402. The openings 440 are generally arranged in the "streets" or non-active areas between the individual dies 430. The openings 440 are discussed in greater detail below with reference to FIGS. 16A and 16B.

Figure 15B:
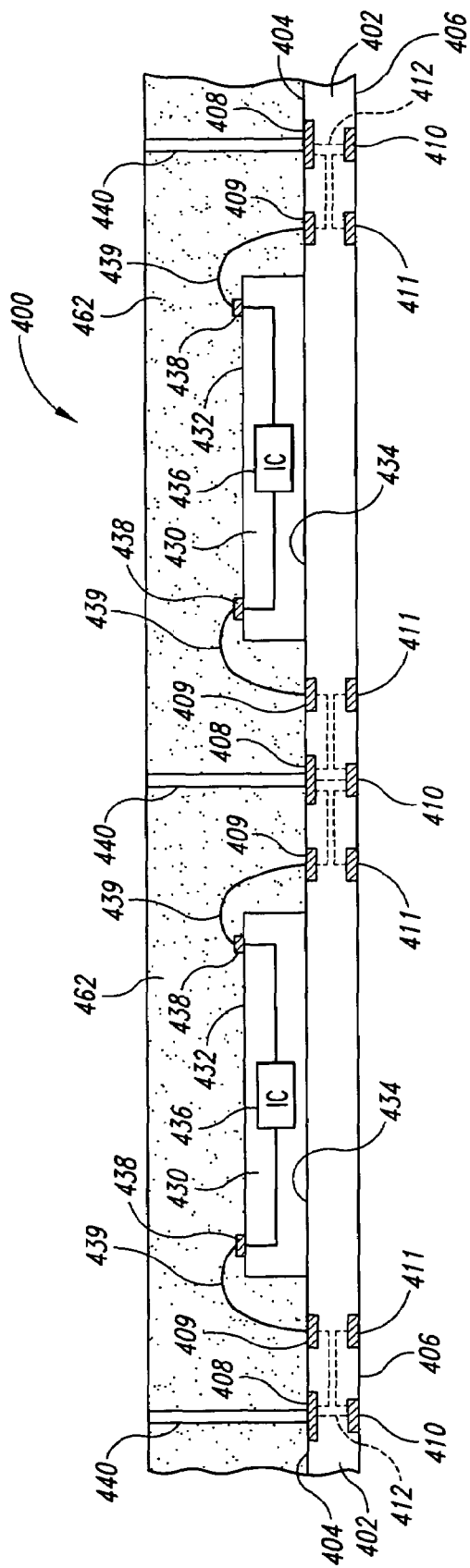

FIG. 15B is a side cross-sectional view taken substantially along lines 15B-15B of FIG. 15A. Referring to FIGS. 15A and 15B together, the support member 402 can include an interposer substrate, a printed circuit board, or other suitable support member. In the illustrated embodiment, the support member 402 includes (a) the first side 404 having a plurality of first contacts 408 and a plurality of second contacts 409, (b) a second side 406 opposite the first side 404 and having a plurality of first pads 410 and a plurality of second pads 411, and (c) a plurality of traces 412 or other type of conductive lines between the first and/or second contacts 408 and 409 and corresponding first and/or second pads 410 and 411 or other contacts (not shown) at the second side 406 of the support member 402. The first and second contacts 408 and 409 can be arranged in arrays for electrical connection to corresponding contacts on the dies 430 and one or more devices stacked on the packaged dies, as described in more detail below. In one aspect of this embodiment, the second pads 411 at the second side 406 of the support member 402 are arranged in an array corresponding to a standard JEDEC pinout. In other embodiments, the support member 402 may include a different number or arrangement of contacts and/or pads.

The individual microelectronic dies 430 can include a front or active side 432, a back side 434 opposite the active side 432, and integrated circuitry 436 (shown schematically). The back side 434 of the dies 430 can be attached to the first side 404 of the support member 402 with an adhesive (not shown). The dies 430 can also include a plurality of terminals 438 (e.g., bond-pads) arranged in an array at the active side 432 and electrically coupled to the integrated circuitry 436. In the illustrated embodiment, the terminals 438 are arranged adjacent a periphery of the dies 430 and used to electrically couple the dies 430 to the support member 402 using a chip-on-board (COB) configuration. More specifically, a plurality of wire-bonds 439 or other types of connectors extend between the terminals 438 and corresponding second contacts 409 on the support member 402. In other embodiments, the dies 430 can have other features and/or the dies can be attached and electrically coupled to the support member 402 using other arrangements, such as an FCIP configuration, a board-on-chip (BOC) configuration, or another suitable configuration.

Figure 16A:
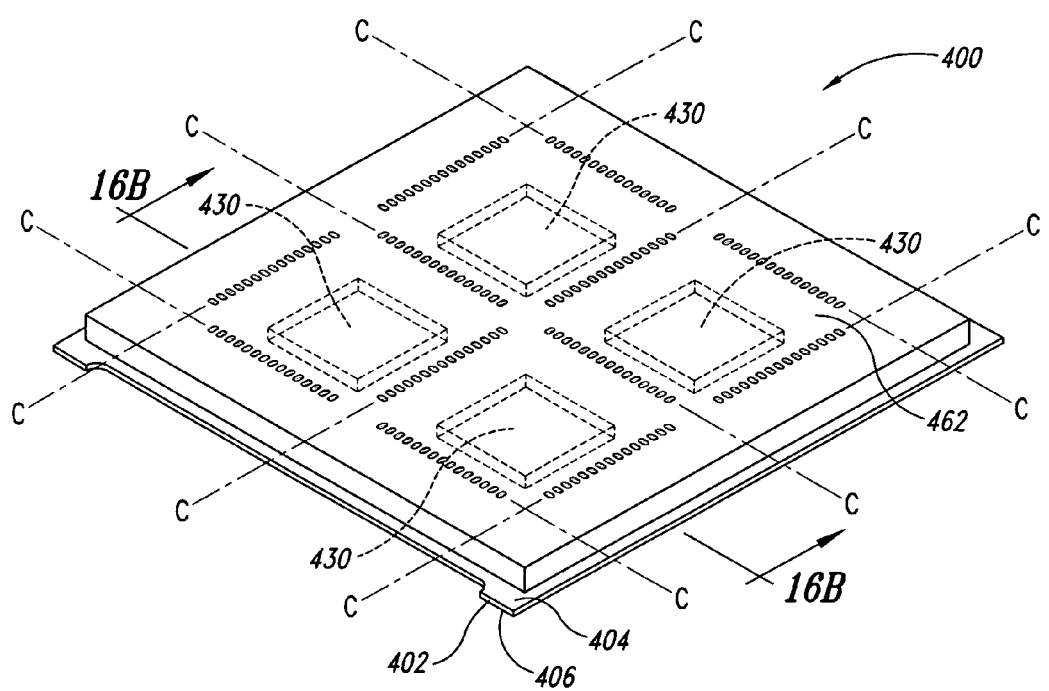
Figure 16B:
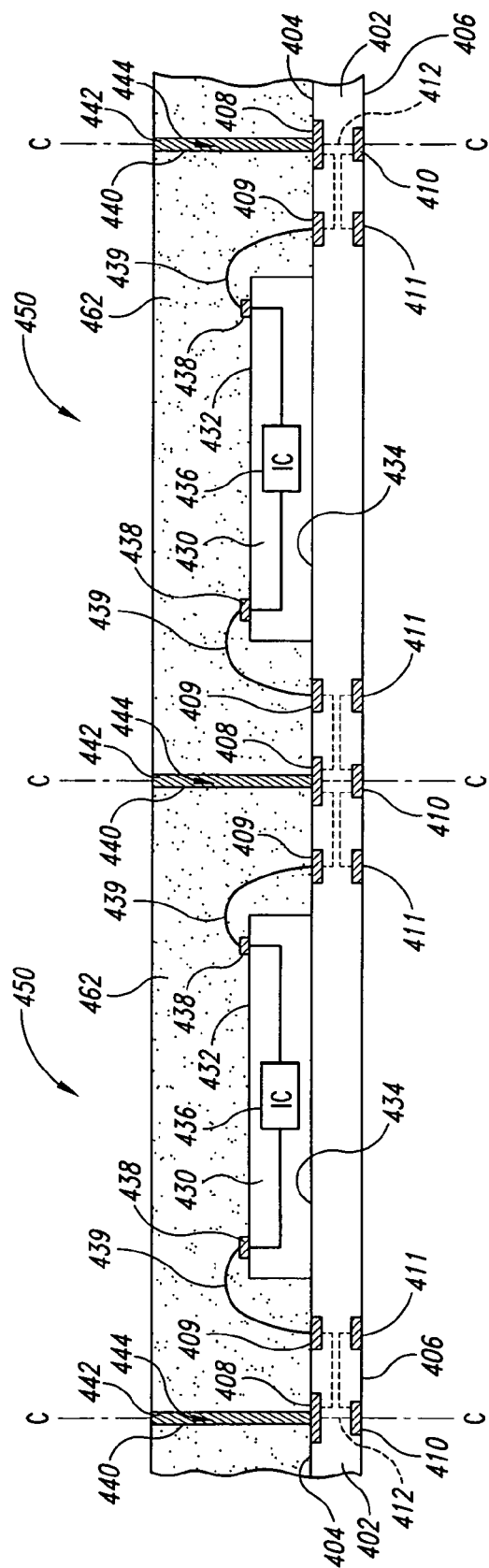

Referring next to FIGS. 16A and 16B, a conductive material 442 is deposited into each of the openings 440 to form a plurality of electrically conductive interconnects 444 extending through the casing 462 to corresponding first contacts 408 on the support member 402. In one embodiment, for example, a solder ball (not shown) is placed at a top portion of each opening 440 and reflowed such that the solder generally fills the corresponding opening. In other embodiments, however, the conductive material 442 can be deposited into the openings 440 using other suitable methods. After forming the conductive interconnects 444, the subassembly 400 can be cut along lines C-C to singulate a plurality of individual microelectronic devices 450.

Figure 17A:
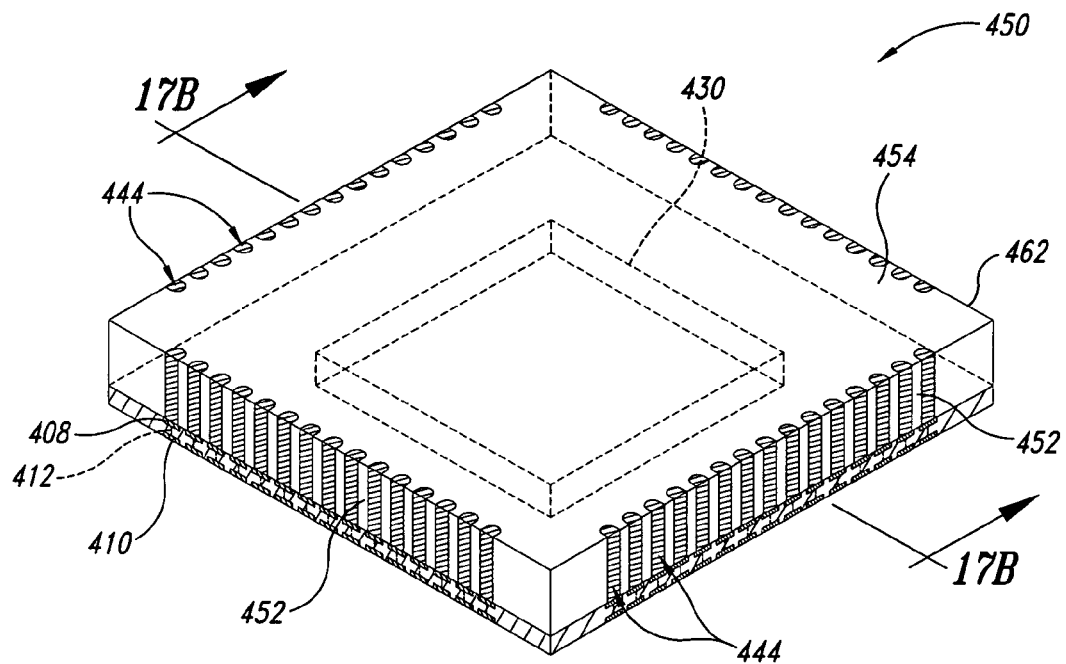
Figure 17B:
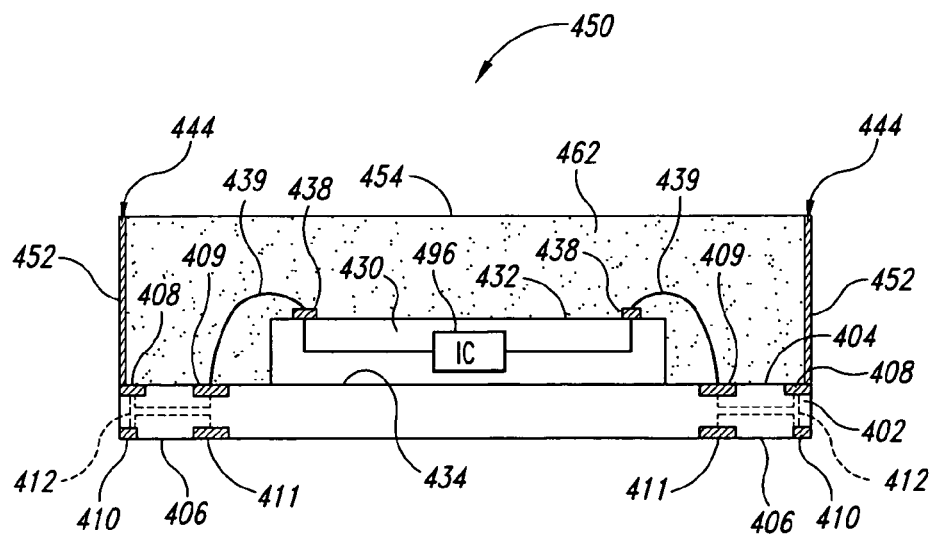

FIG. 17A, for example, is a partially schematic, isometric view of a singulated device 450, and FIG. 17B is a side cross-sectional view taken substantially along lines 17B-17B of FIG. 17A. Referring to FIGS. 17A and 17B together, the individual devices 450 can be tested at this stage of the method to ensure that each device functions properly so that only known good devices undergo further processing. The device 450 illustrated in FIGS. 17A and 17B is configured to be a "bottom" or "lower" device in a stacked microelectronic device and, accordingly, a plurality of electrical couplers (not shown) can be attached to corresponding second pads 411 at the second side of the support member 402. As discussed previously, the second pads 411 are arranged to have a standard JEDEC pinout. On the other hand, if the device 450 was configured to be an "upper" device (i.e., a device stacked on one or more lower devices), the second pads 411 could have a different arrangement and/or electrical couplers may not be attached to the second pads.

One feature of the device 450 is that the interconnects 444 are at least partially exposed at a top portion 454 and a periphery portion 452 of the device 450. The exposed interconnects 444 accordingly define an electrical pathway between the first and second pads 410 and 411 at the second side 406 of the support member 402 and the top portion 454 of the device 450. As explained below, this feature can facilitate stacking of two or more devices 450.

Figure 18:
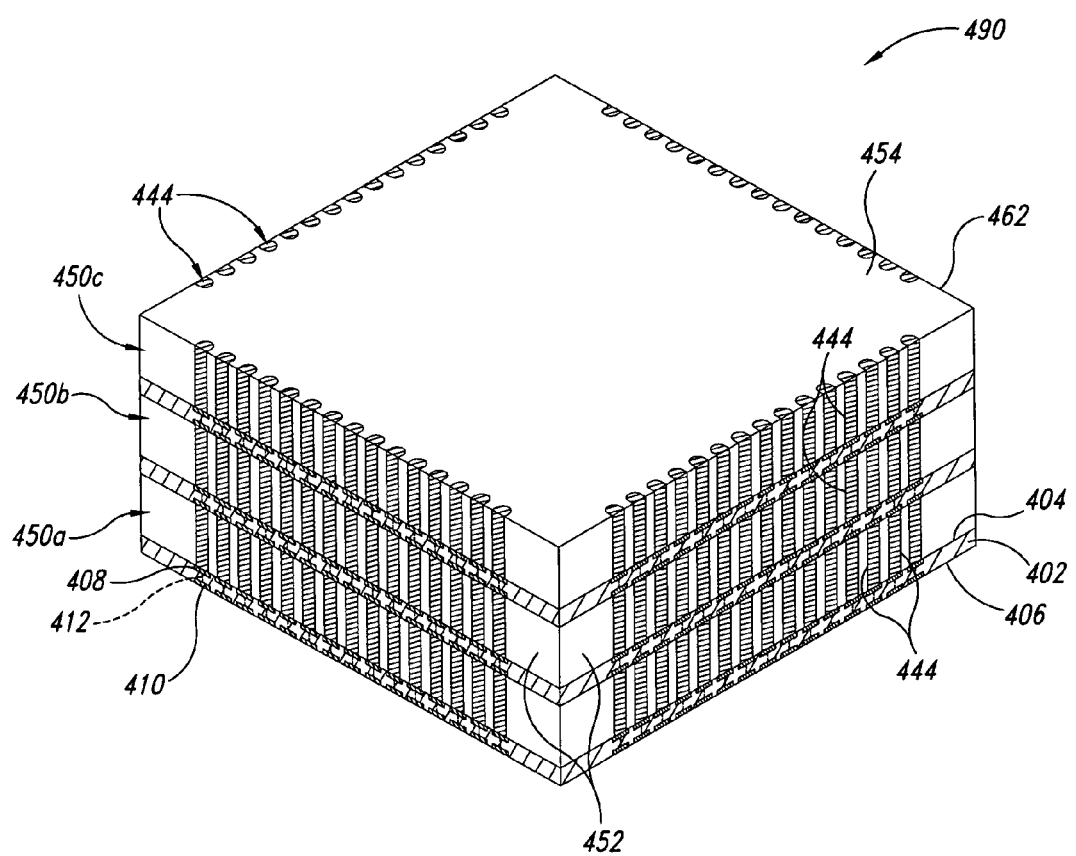

FIG. 18, for example, is a partially schematic, isometric view of a stacked microelectronic device assembly 490 including a first microelectronic device 450a, a second upper microelectronic device 450b stacked on the first microelectronic device 450a, and a third microelectronic device 450c on the second microelectronic device 450b. The devices 450a-c can be generally similar to the devices 450 described above with respect to FIGS. 15A-17B. The second device 450b can be coupled to the first device 450a by attaching the first pads 410b at the second side 406 of the second device's support member 402 to corresponding exposed portions of the first device's interconnects 444 at the top portion 454 of the first device 450a. The third device 450c can be coupled to the second device 450b in a generally similar manner.

In one embodiment, a plurality of extremely small alignment holes (not shown) can be formed completely through each device 450a-c before stacking the devices together. Either during or after stacking the devices 450 together, a laser beam or other suitable beam of light can be directed through the alignment holes in the stacked assembly 490 to ensure that the individual devices are properly aligned relative to each other so that the external electrical contacts on each device are in contact with appropriate contacts on the adjoining device(s). For example, if the beam passes completely through the stacked assembly, the alignment holes in each device are properly aligned. On the other hand, if the light does not pass completely through the stacked assembly, one or more of the devices are out of alignment. In other embodiments, other suitable methods can be used to align the individual devices 450 relative to each other in the stacked assembly 490.

Figure 19:
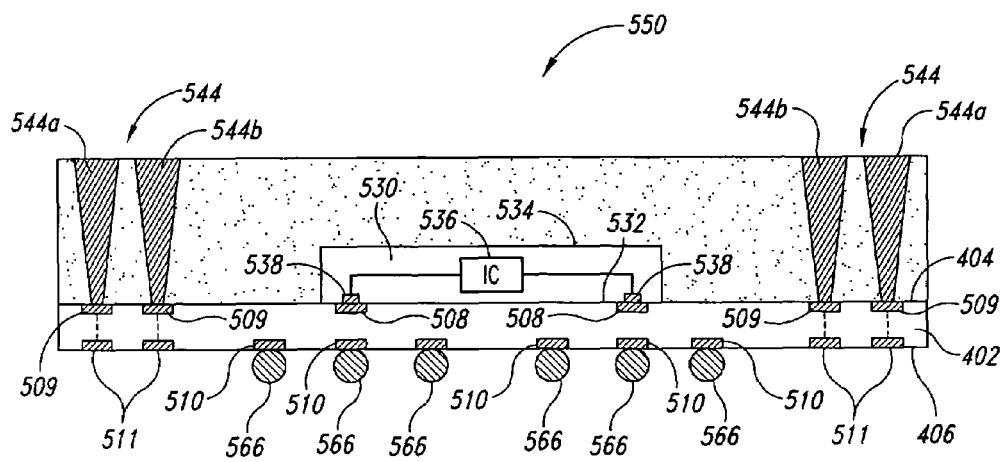
FIGS. 19 and 20 illustrate stages of a method for manufacturing a plurality of stacked microelectronic devices in accordance with still yet another embodiment of the invention.
Figure 20:
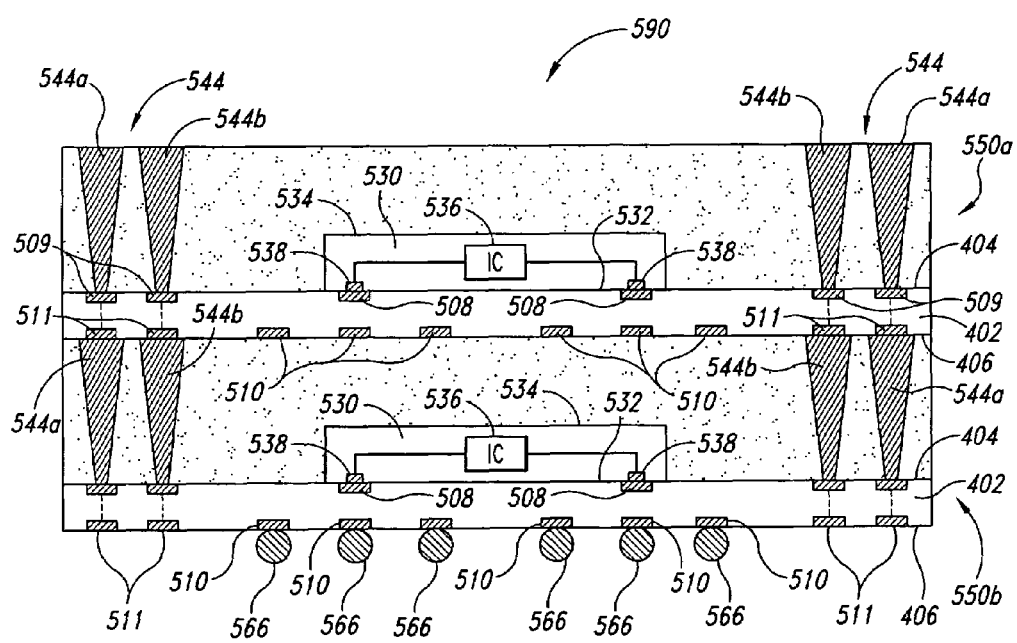

FIGS. 19 and 20 illustrate stages of a method for manufacturing a plurality of stacked microelectronic devices in accordance with still yet another embodiment of the invention. This method can include several steps that are at least generally similar to those described above with respect to FIGS. 15A-17B. FIG. 19, for example, is a side cross-sectional view of a microelectronic device 550 having a number of features generally similar to the devices 450 described above with reference to FIGS. 15A-17B. The arrangement of the die and the configuration of the interconnects in the device 550, however, differ from the arrangement of the die 430 and the interconnects 444 in the devices 450. More specifically, the device 550 includes a die 530 having a FCIP configuration rather than the COB configuration of the die 430 in the devices 450 described above. Moreover, the device 550 includes a plurality of interconnects 544 positioned inboard of a periphery portion 554 of the device 550, in contrast with the interconnects 444 that are at least partially exposed about the periphery portion 452 of the devices 450.

The die 530 of the device 550 can include an active side 532 attached to the first side 404 of the support member 402, a back side 534 opposite the active side 532, and integrated circuitry 536 (shown schematically). The die 530 can also include a plurality of terminals 538 electrically coupled to the integrated circuitry 536 and attached to corresponding first contacts 508 at the first side 404 of the support member 402. The first contacts 508 can have a different arrangement on the support member 402 than the arrangement of first contacts 408 described previously. In other embodiments, the die 530 can include different features and/or can be attached to the support member 402 using a different arrangement.

The interconnects 544 extend through the casing 462 to corresponding second contacts 509 on the support member 402. The interconnects 544 can be formed using methods generally similar to those used to form the interconnects 444 described above. One particular aspect of the interconnects 544 in the illustrated embodiment is that the interconnects are arranged in laterally adjacent pairs (shown as a first interconnect 544a and a second interconnect 544b) about the die 530. One advantage of this feature is that it increases the number of signals that can be passed from the device 550 to an external device without substantially increasing the footprint of the device 550. In other embodiments, the interconnects 544 can have different arrangements about the die (e.g., single interconnects arranged inboard of the periphery of the device 550 or more than two interconnects arranged together).

The device 550 also includes a plurality of first pads 510 and a plurality of second pads 511 at the second side 406 of the support member 402. The first pads 510 are arranged in an array corresponding to a standard JEDEC pinout and the second pads 511 are arranged in a pattern generally corresponding to the arrangement of the second contacts 509 at the first side 404 of the support member 402 to facilitate stacking of two more devices 550. In several embodiments, a plurality of electrical couplers 566 (e.g., solder balls) can be attached to corresponding first pads 510.

FIG. 20, for example, is a side cross-sectional view of a stacked microelectronic device assembly 590 including an upper microelectronic device 550a stacked on top of a lower microelectronic device 550b. The upper and lower devices 550a and 550b can be generally similar to the microelectronic device 550 described above with respect to FIG. 19. The upper device 550a differs from the device 550 described above, however, in that the device 550a is configured to be an "upper" device in a stacked assembly and, accordingly, the upper device 550a generally does not include electrical couplers attached to the first pads 510a.

The upper device 550a is coupled to the lower device 550b by attaching and electrically coupling the second pads 511 of the upper device 550a to corresponding interconnects 544 on the lower device 550b. In the illustrated embodiment, for example, the second side 406 of the upper device's support member 402 is in direct contact with the top portion of the lower device's casing. In other embodiments, however, a plurality of electrical couplers (not shown) may be used to couple the upper device's second pads 511 to corresponding interconnects 544 on the lower device 550b. In embodiments including electrical couplers, a filler material (not shown) may also be deposited into the resulting gap between the upper device 550a and the lower device 550b.

One feature of the stacked assemblies 190/290/490/590 described above with respect to FIGS. 7, 13, 18, and 20, respectively, is that the individual microelectronic devices 170/250/450/550 in each assembly include through-packaging interconnects that are at least partially exposed at a top portion of each device's casing to facilitate stacking of the individual devices without requiring intermediate structures or large solder balls between the stacked devices. An advantage of this feature is that it can reduce the vertical profiles of the stacked assemblies 190/2901490/590. Devices with smaller vertical profiles are extremely desirable in cell phones, PDAs, and other electronic devices where there is a constant drive to reduce the size of microelectronic components used in such devices.

From the foregoing, it will be appreciated that specific embodiments of the invention have been described herein for purposes of illustration, but that various modifications may be made without deviating from the invention. For example, one or more additional microelectronic devices may be stacked on the devices in each of the embodiments described above to form stacked devices including a greater number of stacked units. Furthermore, one or more additional microelectronic dies may be stacked on the dies in each of the microelectronic devices described above to form individual microelectronic devices having more than one die. The microelectronic devices may also include a number of other different features and/or arrangements. Aspects of the invention described in the context of particular embodiments may be combined or eliminated in other embodiments. Further, although advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A stacked microelectronic device assembly, comprising:
a first known good packaged microelectronic device including (a) a first interposer substrate with a plurality of first interposer contacts, (b) a first die carried by and electrically coupled to the first interposer substrate, wherein the first die includes an active side facing away from the first interposer substrate and a plurality of first terminals at the active side of the first die and electrically coupled to the first interposer substrate with a plurality of first wire bonds, (c) a first casing having a first face at the first interposer substrate and a second face opposite the first face such that the first casing completely encapsulates the first die and at least a portion of the first interposer substrate, and (d) a plurality of first through-casing interconnects at least partially encapsulated in the first casing and in contact with corresponding first interposer contacts, wherein the first interconnects extend from the first face to the second face; and
a second known good packaged microelectronic device coupled to the first device in a stacked configuration, the second device including (a) a second interposer substrate with a plurality of second interposer pads, (b) a second die carried by and electrically coupled to the second interposer substrate, wherein the second die includes an active side facing away from the second interposer substrate and a plurality of second terminals at the active side of the second die and electrically coupled to the second interposer substrate with a plurality of second wire bonds, and (c) a second casing that completely encapsulates the second die and at least a portion of the second interposer substrate, wherein the second interposer pads are in direct contact with and electrically coupled to exposed portions of the corresponding first interconnects at the second face of the first casing.

2. The assembly of claim 1 wherein:
the first interposer substrate includes a first side and a second side opposite the first side, the first interposer contacts being arranged in a desired pattern at the first side;
the first interconnects comprise a plurality of first conductive lead fingers attached to the first side of the first interposer substrate and projecting inwardly from a periphery of the first casing toward the first die, the first lead fingers being electrically coupled to corresponding first interposer contacts;
the second interposer substrate includes a first side, a second side opposite the first side, a plurality of second interposer contacts arranged in a desired pattern at the first side, and the second interposer pads arranged in a desired pattern at the second side; and
the assembly further comprises a plurality of second conductive lead fingers attached to the first side of the second interposer substrate and projecting inwardly from a periphery of the second casing toward the second die, the second lead fingers being electrically coupled to corresponding second interposer contacts.

3. The assembly of claim 2 wherein the individual first and second lead fingers each include:
a front portion facing toward the first and second die, respectively; and
a back portion opposite the front portion and generally aligned with the periphery of the first and second casing, respectively, such that at least a portion of each of the first and second lead fingers is accessible at the periphery of the first casing and the second casing, respectively.

4. The assembly of claim 1 wherein:
the first interposer substrate includes a first side and a second side opposite the first side, the first interposer contacts being arranged in a desired pattern at the first side;
the first terminals at the active side of the first die are electrically coupled to corresponding first interposer contacts with the plurality of first wire-bonds;
the second interposer substrate includes a first side, a second side opposite the first side, a plurality of second interposer contacts arranged in a desired pattern at the first side, and the second interposer pads arranged in a desired pattern at the second side; and
the second terminals at the active side of the second die are electrically coupled to corresponding second interposer contacts with the plurality of second wire-bonds.

5. The assembly of claim 1 wherein the first interposer substrate includes a first side, a second side opposite the first side, the first interposer contacts arranged in a desired pattern at the first side, and a plurality of first interposer pads at the second side arranged in a pattern corresponding to a standard JEDEC pinout.

6. The assembly of claim 5, further comprising a plurality of electrical couplers attached to corresponding first interposer pads.

7. The assembly of claim 1 wherein:
the second interposer substrate includes a first side, a second side opposite the first side, a plurality of second interposer contacts arranged in a desired pattern at the first side, and the second interposer pads arranged in a desired pattern at the second side;
the second casing has a first face at the first side of the second interposer substrate and a second face opposite the first face;
the second device further comprises a plurality of second through-casing interconnects at least partially encapsulated in the second casing and in contact with corresponding second interposer contacts, the second interconnects extending from the first face of the second casing to the second face of the second casing; and
the assembly further comprises a third known good packaged microelectronic device coupled to the second device in a stacked configuration, the third device including (a) a third interposer substrate with a plurality of third interposer pads, (b) a third die carried by and electrically coupled to the third interposer substrate, and (c) a third casing that encapsulates the third die and at least a portion of the third interposer substrate, wherein the third interposer pads are electrically coupled to the exposed portions of the corresponding second interconnects at the second face of the second casing.

8. The assembly of claim 2 wherein:
the first lead fingers are in direct contact with corresponding first interposer contacts; and
the second lead fingers are in direct contact with corresponding second interposer contacts.

9. The assembly of claim 2 wherein the individual first and second lead fingers have the same or approximately the same height, and wherein the height of the first lead fingers and the second lead fingers is greater than a height of the first die and the second die, respectively.

10. The assembly of claim 1 wherein the first interconnects comprise a first lead frame, and wherein the second interconnects comprise a second lead frame, and wherein the individual lead frames are self-supporting structures including a plurality of lead fingers spaced apart from each other and projecting inwardly toward the respective first and second dies.

11. The assembly of claim 1 wherein:
the first interconnects are accessible at a periphery of the first casing; and
the second interconnects are accessible at a periphery of the second casing.

* * * * *